US009490362B2

(12) United States Patent
Masuoka et al.

(10) Patent No.: US 9,490,362 B2
(45) Date of Patent: Nov. 8, 2016

(54) SEMICONDUCTOR DEVICE PRODUCTION METHOD AND SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP); Hiroki Nakamura, Tokyo (JP); Yisuo Li, Singapore (SG); Aashit Ramachandra Kamath, Singapore (SG); Zhixian Chen, Singapore (SG); Teng Soong Phua, Singapore (SG); Xinpeng Wang, Singapore (SG); Patrick Guo-Qiang Lo, Singapore (SG)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

(21) Appl. No.: 14/744,890

(22) Filed: Jun. 19, 2015

(65) Prior Publication Data

US 2015/0287822 A1  Oct. 8, 2015

Related U.S. Application Data

(63) Continuation of application No. PCT/JP2013/061653, filed on Apr. 19, 2013.

(51) Int. Cl.
*H01L 29/78* (2006.01)
*H01L 29/423* (2006.01)
(Continued)

(52) U.S. Cl.
CPC ..... *H01L 29/7827* (2013.01); *H01L 21/28035* (2013.01); *H01L 21/28238* (2013.01);
(Continued)

(58) Field of Classification Search
CPC ............. H01L 29/78; H01L 29/42392; H01L 27/085; H01L 27/088
See application file for complete search history.

(56) References Cited

U.S. PATENT DOCUMENTS

2010/0207201 A1  8/2010  Masuoka et al.
2010/0213539 A1  8/2010  Masuoka et al.
(Continued)

FOREIGN PATENT DOCUMENTS

JP  H02-071556 A  3/1990
JP  H02-188966 A  7/1990
(Continued)

OTHER PUBLICATIONS

International Search Report and Written Opinion with English translation for PCT/JP2013/061653 dated Jun. 4, 2013, 7 pages.
(Continued)

*Primary Examiner* — Jae Lee
(74) *Attorney, Agent, or Firm* — Brinks Gilson & Lione

(57) ABSTRACT

A semiconductor device production method includes a first step of forming a planar silicon layer on a silicon substrate and forming first and second pillar-shaped silicon layers on the planar silicon layer; a second step of forming a gate insulating film around the first and second pillar-shaped silicon layers, forming a metal film and a polysilicon film around the gate insulating film, controlling a thickness of the polysilicon film to be smaller than a half of a distance between the first and second pillar-shaped silicon layers, depositing a resist, exposing the polysilicon film on side walls of upper portions of the first and second pillar-shaped semiconductor layers, etching-away the exposed polysilicon film, stripping the third resist, and etching-away the metal film; and a third step of forming a resist for forming a gate line and performing anisotropic etching to form a gate line and first and second gate electrodes.

4 Claims, 40 Drawing Sheets

(51) Int. Cl.
- *H01L 29/49* (2006.01)
- *H01L 27/092* (2006.01)
- *H01L 21/8238* (2006.01)
- *H01L 21/28* (2006.01)
- *H01L 21/285* (2006.01)
- *H01L 21/3213* (2006.01)
- *H01L 21/8234* (2006.01)
- *H01L 27/088* (2006.01)
- *H01L 29/06* (2006.01)
- *H01L 29/10* (2006.01)
- *H01L 29/66* (2006.01)

(52) U.S. Cl.
CPC ... *H01L21/28518* (2013.01); *H01L 21/32134* (2013.01); *H01L 21/32139* (2013.01); *H01L 21/823437* (2013.01); *H01L 21/823475* (2013.01); *H01L 21/823487* (2013.01); *H01L 21/823885* (2013.01); *H01L 27/088* (2013.01); *H01L 27/092* (2013.01); *H01L 29/0692* (2013.01); *H01L 29/1037* (2013.01); *H01L 29/1054* (2013.01); *H01L 29/423* (2013.01); *H01L 29/42356* (2013.01); *H01L 29/49* (2013.01); *H01L 29/4916* (2013.01); *H01L 29/66666* (2013.01)

(56) References Cited

U.S. PATENT DOCUMENTS

| | | | |
|---|---|---|---|
| 2011/0303973 | A1 | 12/2011 | Masuoka et al. |
| 2011/0303985 | A1* | 12/2011 | Masuoka ............... H01L 21/84 257/369 |
| 2012/0104487 | A1* | 5/2012 | Ikebuchi ........... H01L 27/10876 257/329 |
| 2012/0196415 | A1 | 8/2012 | Masuoka et al. |
| 2012/0270374 | A1 | 10/2012 | Masuoka et al. |
| 2014/0166971 | A1* | 6/2014 | Park .................... H01L 27/2454 257/5 |

FOREIGN PATENT DOCUMENTS

| | | |
|---|---|---|
| JP | H03-145761 A | 6/1991 |
| JP | 2009-182317 A | 8/2009 |
| JP | 2010-272874 A | 12/2010 |
| JP | 2011-258780 A | 12/2011 |
| JP | 2012-004244 A | 1/2012 |

OTHER PUBLICATIONS

English translation of International Preliminary Report on Patentability for corresponding International Application No. PCT/JP2013/061653 dated Oct. 29, 2015, 7 pages.

\* cited by examiner

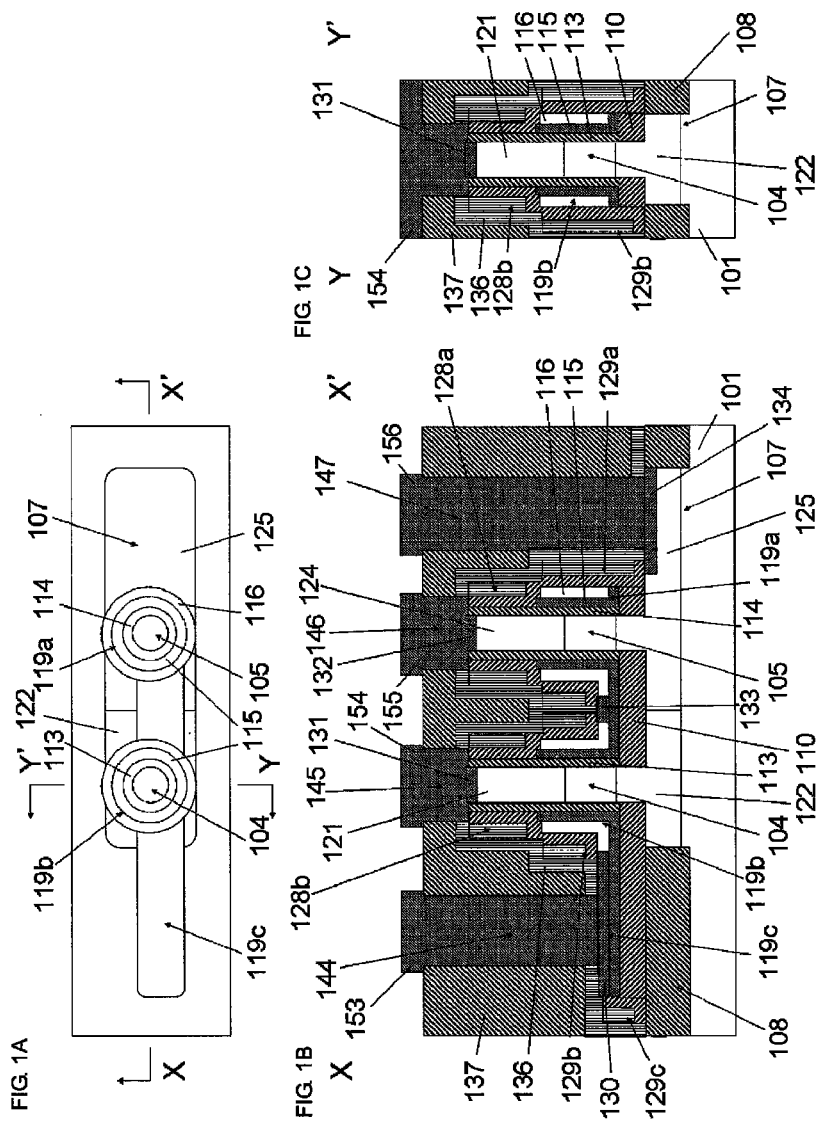

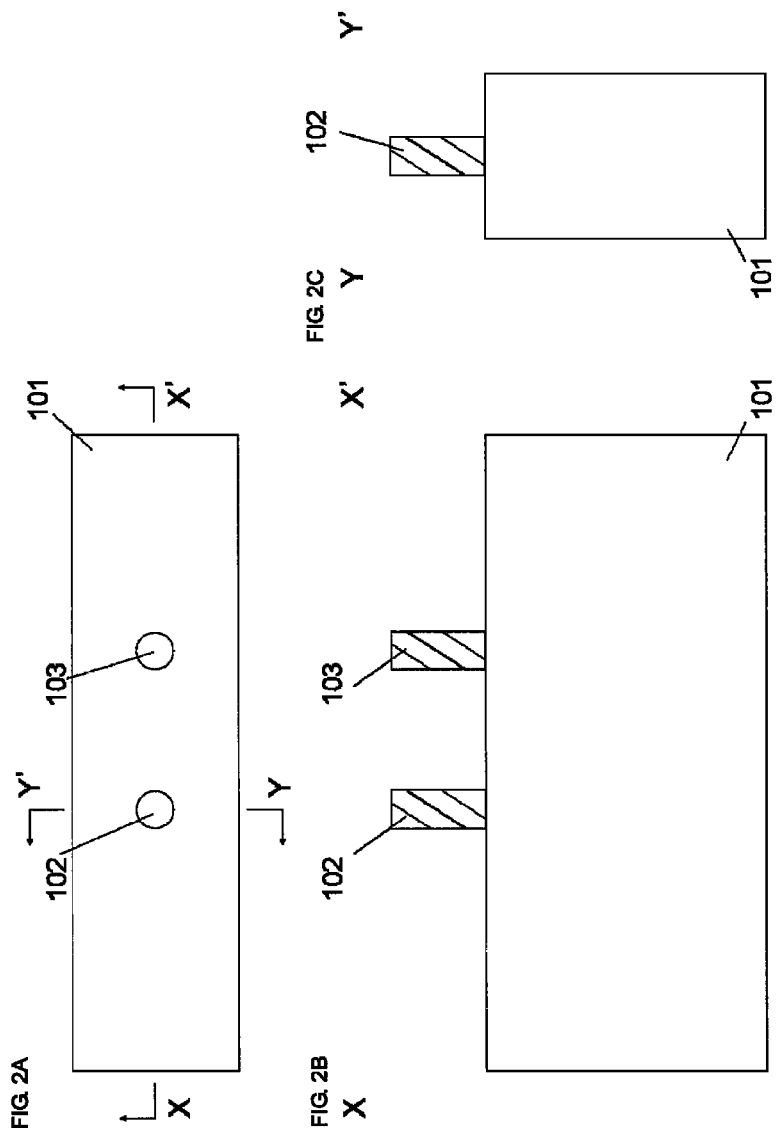

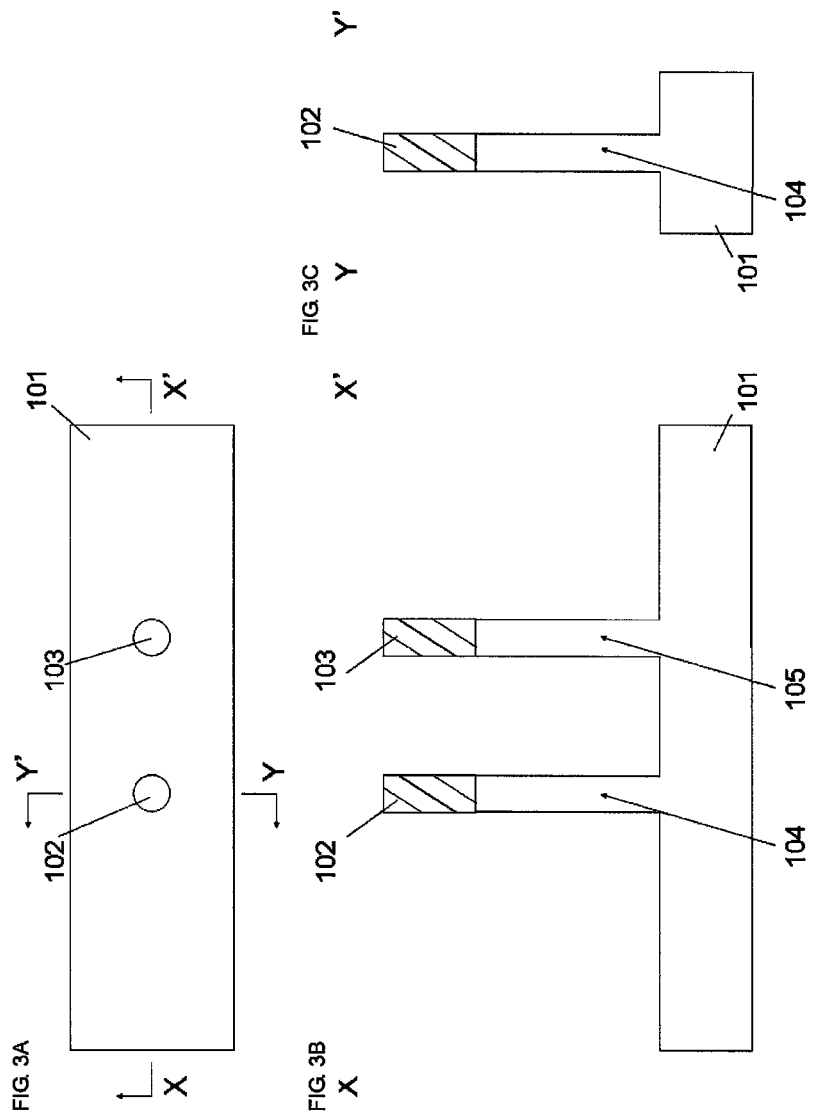

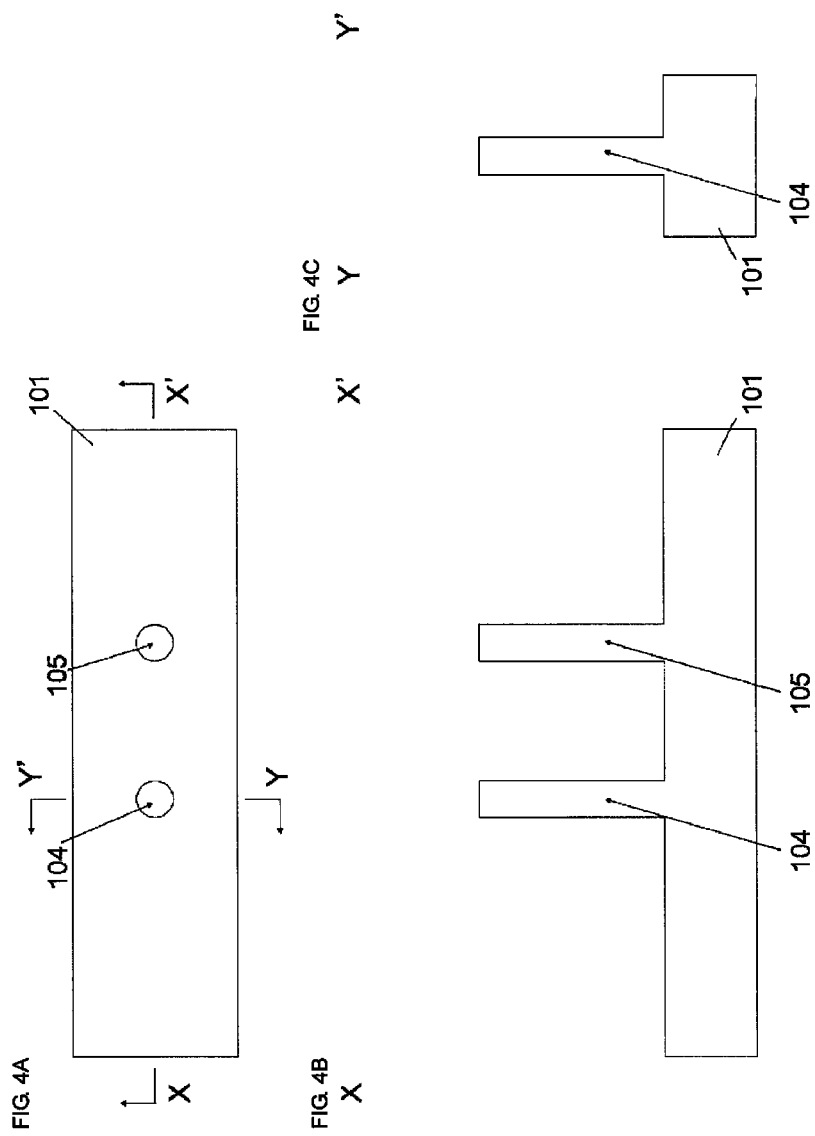

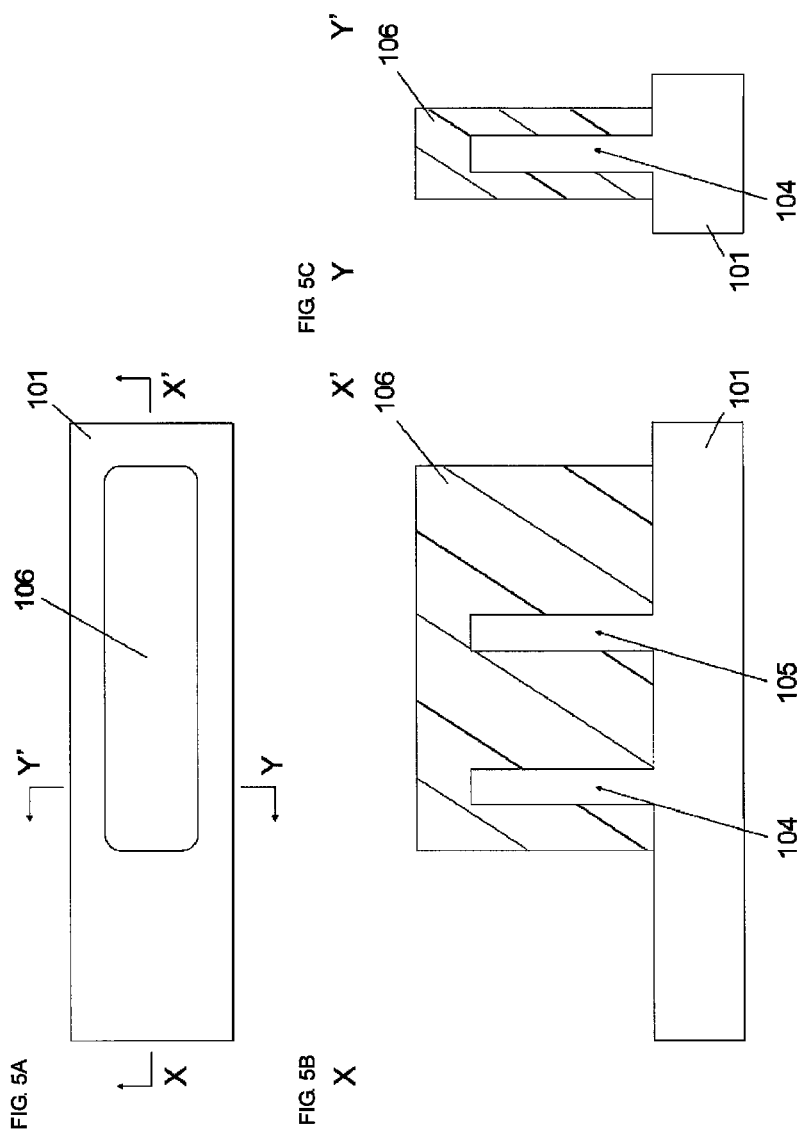

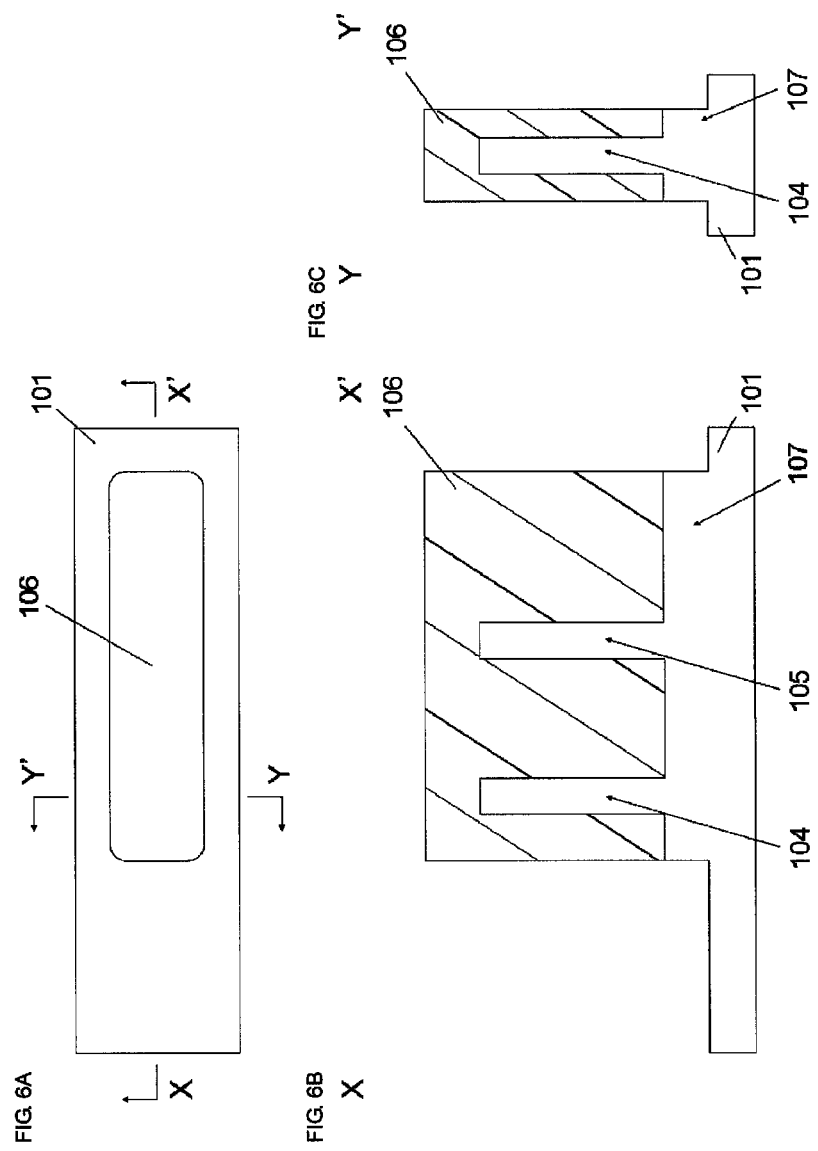

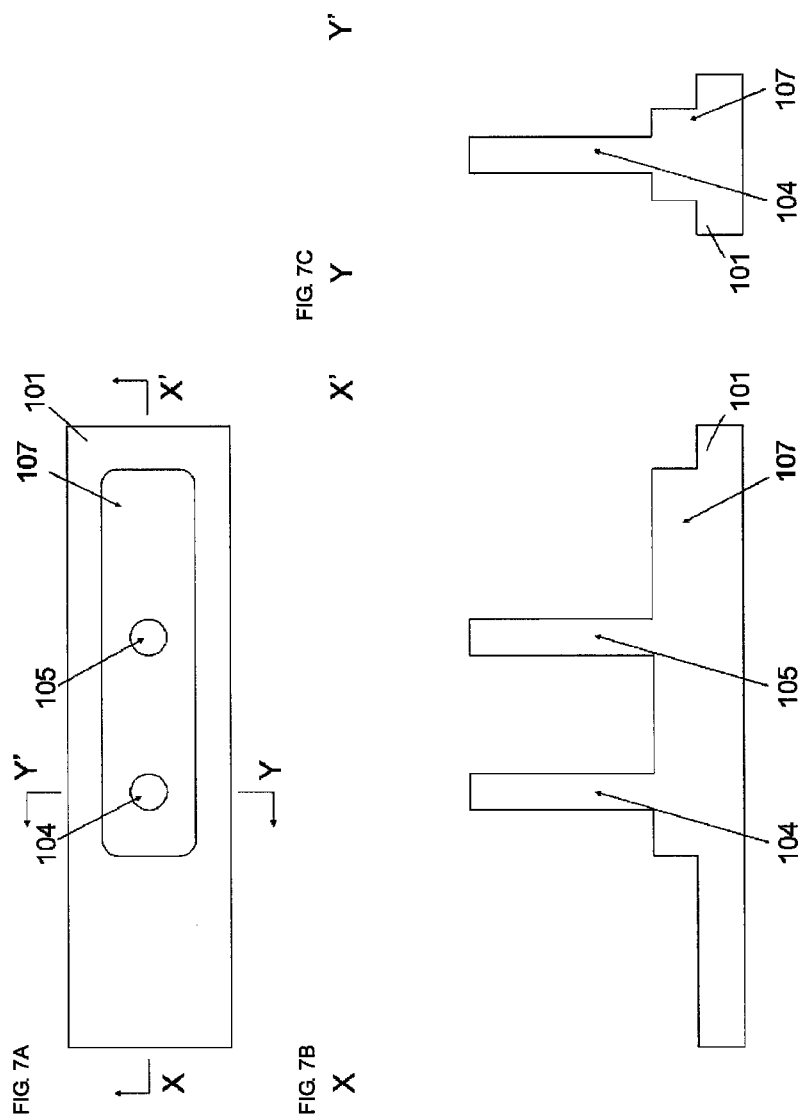

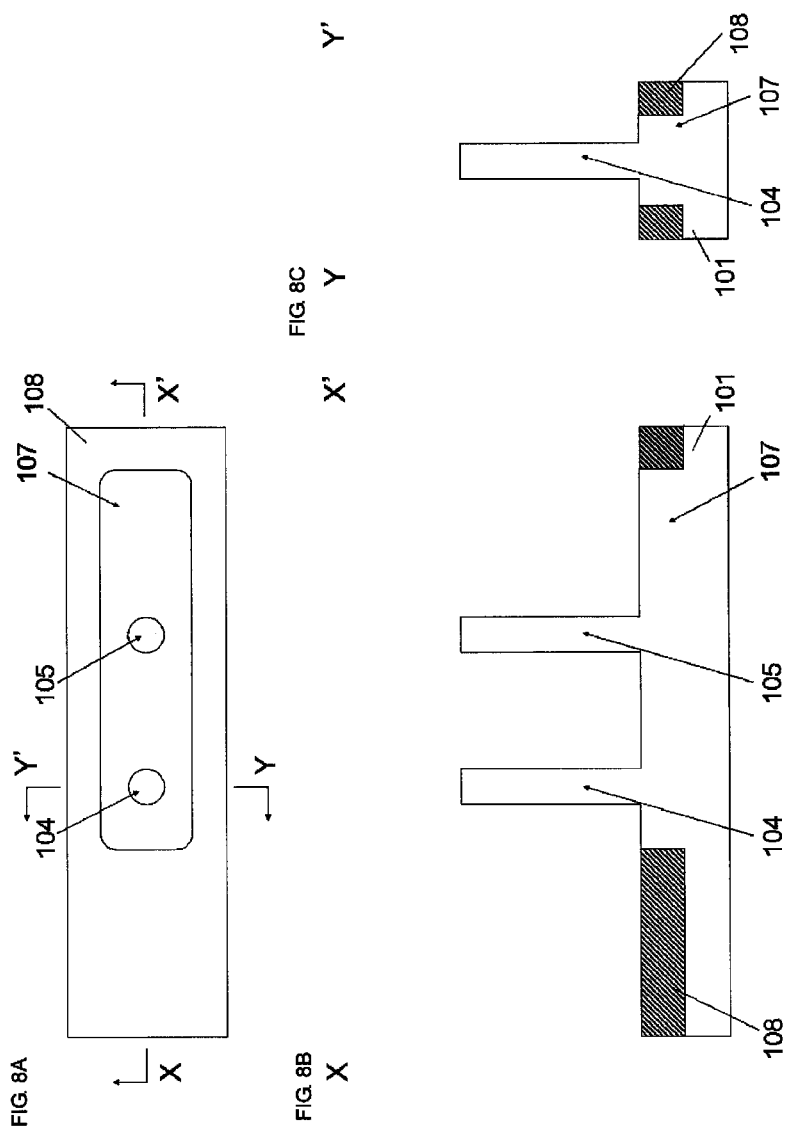

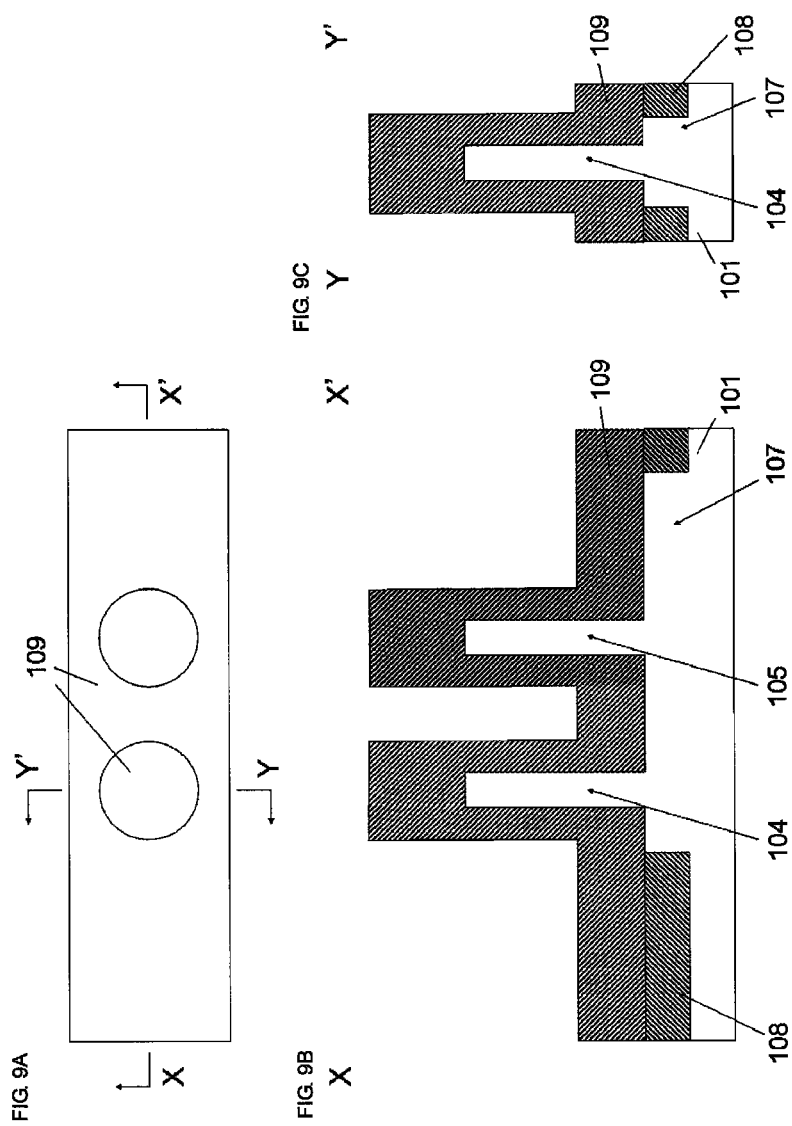

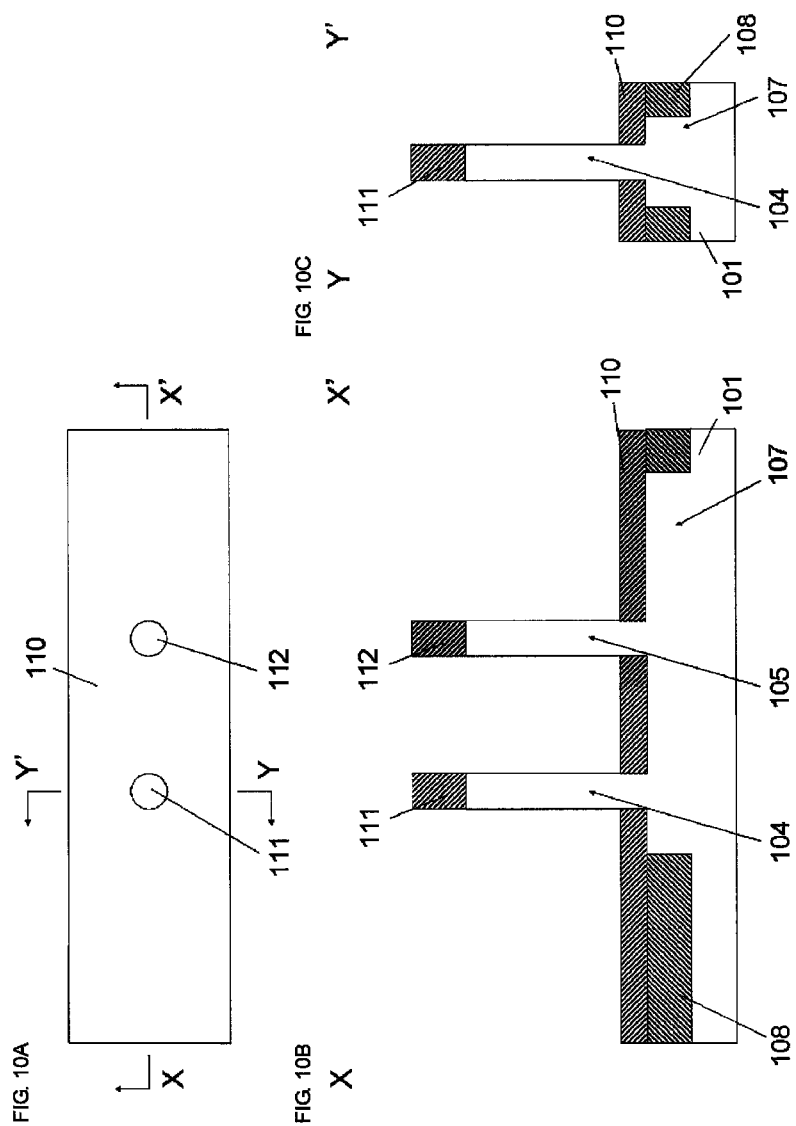

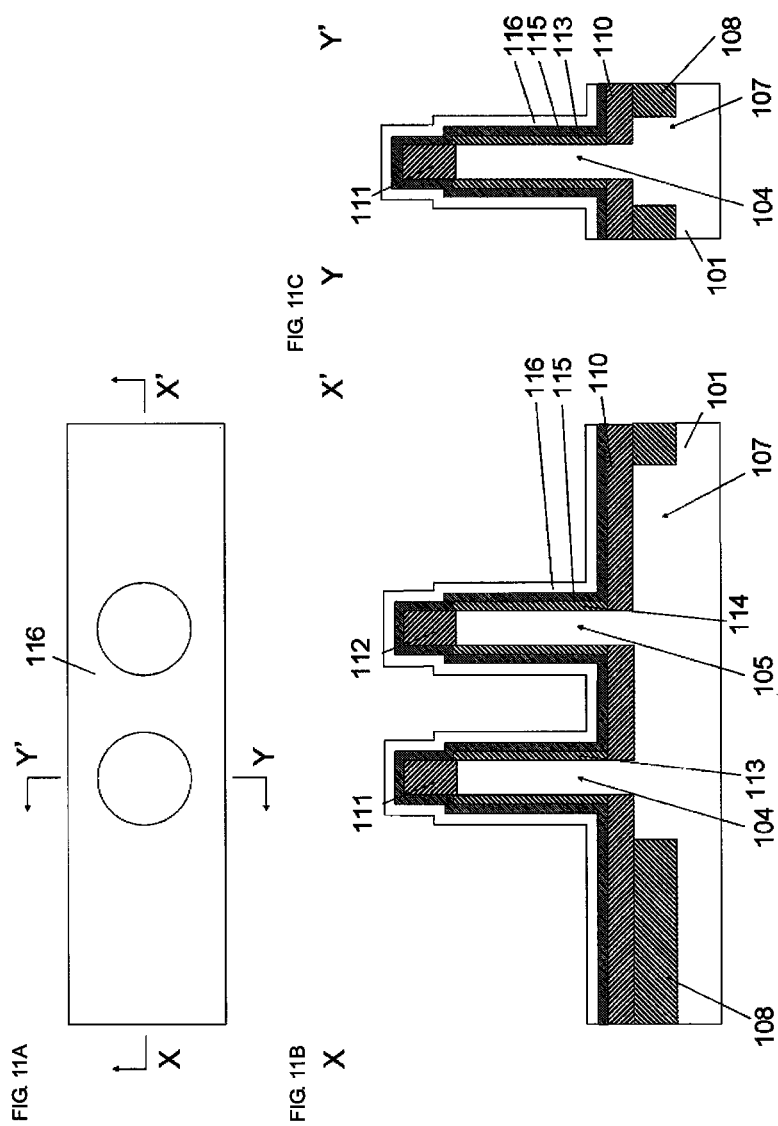

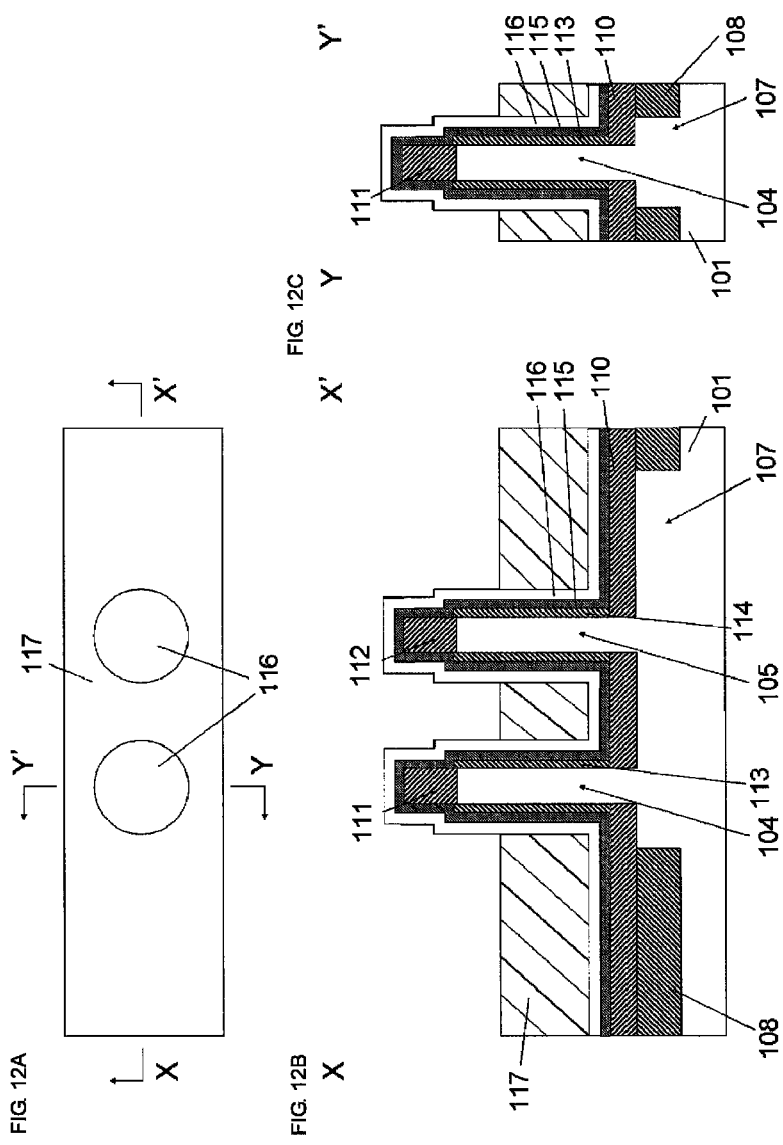

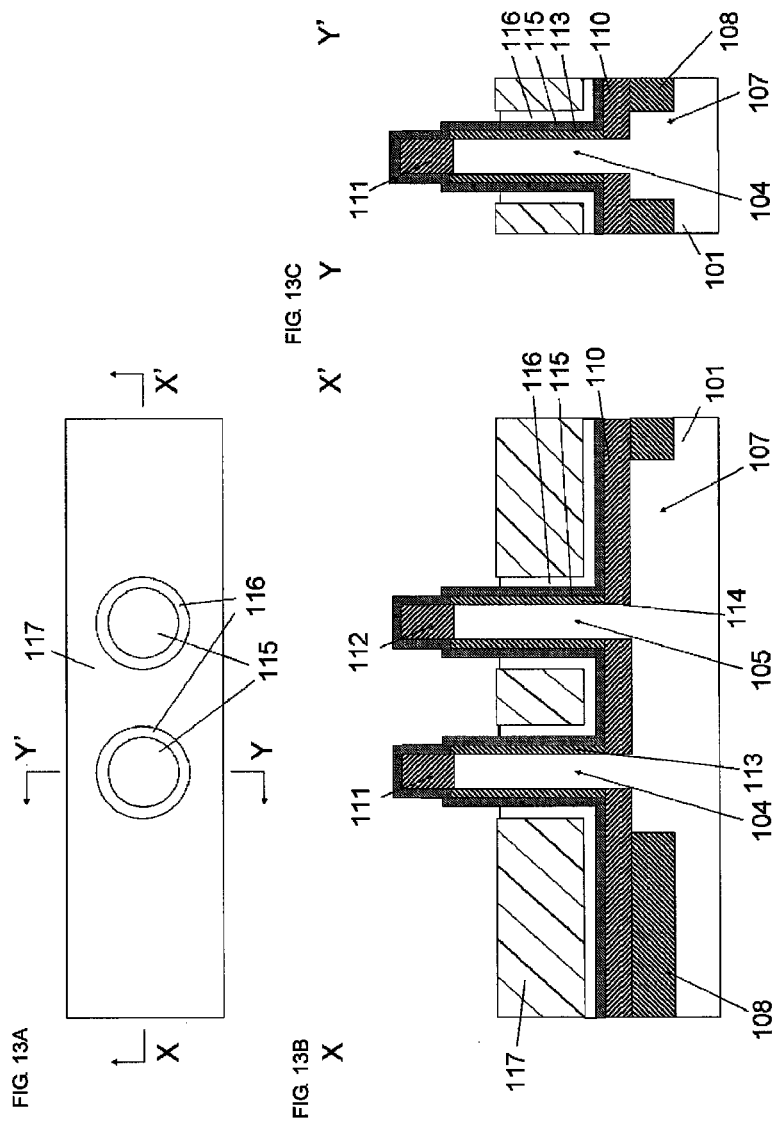

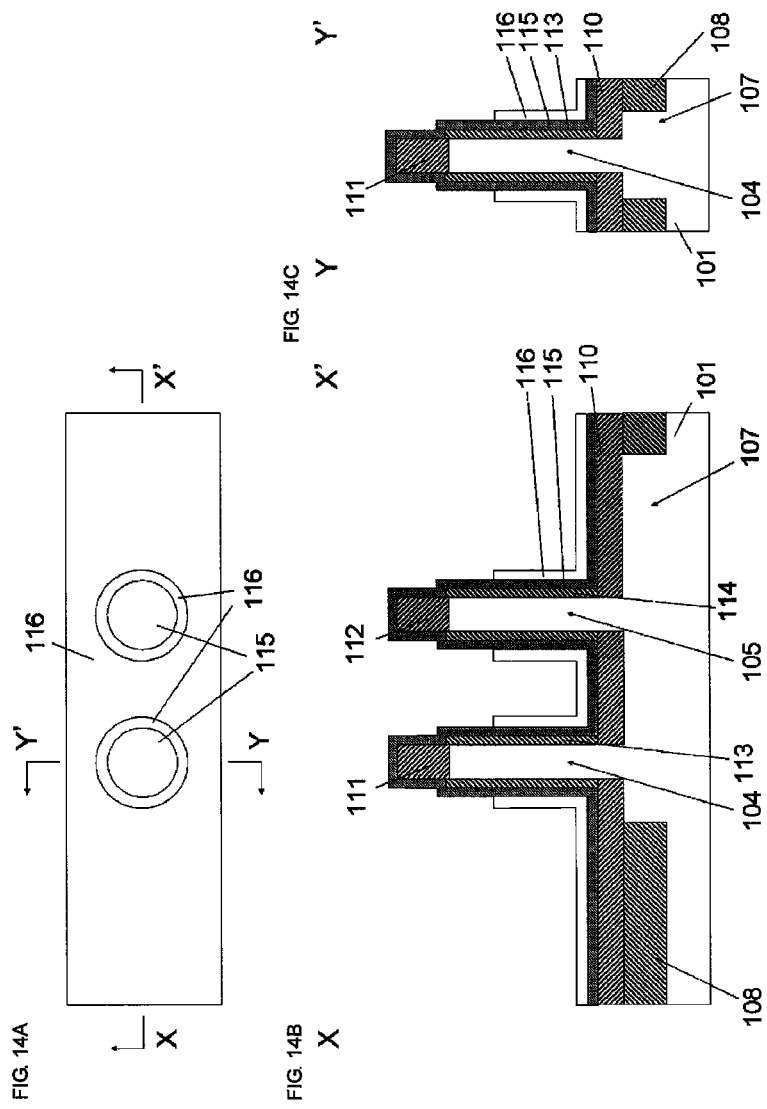

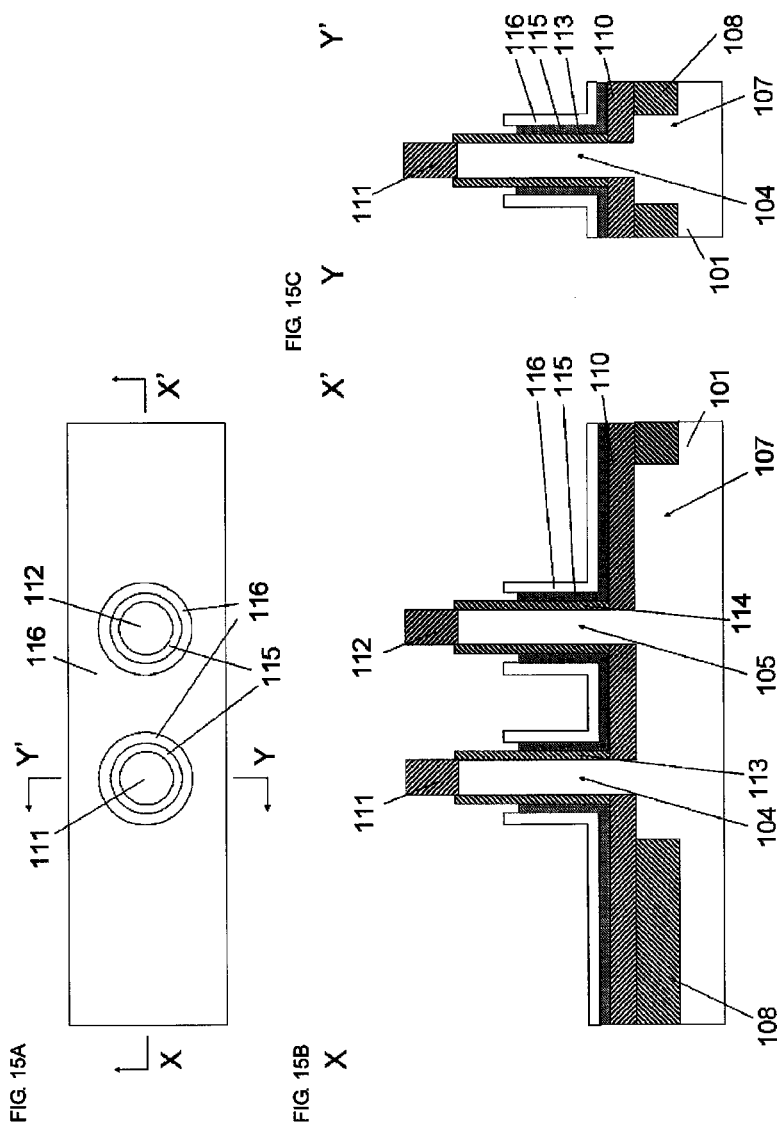

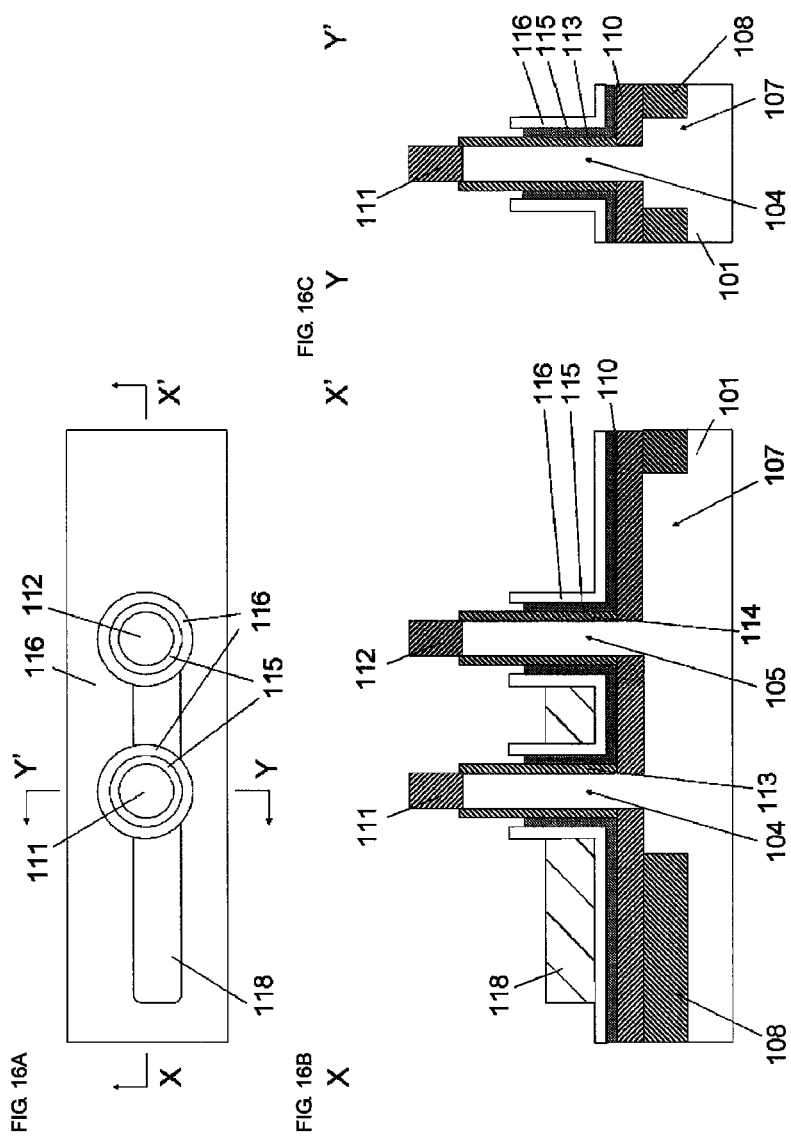

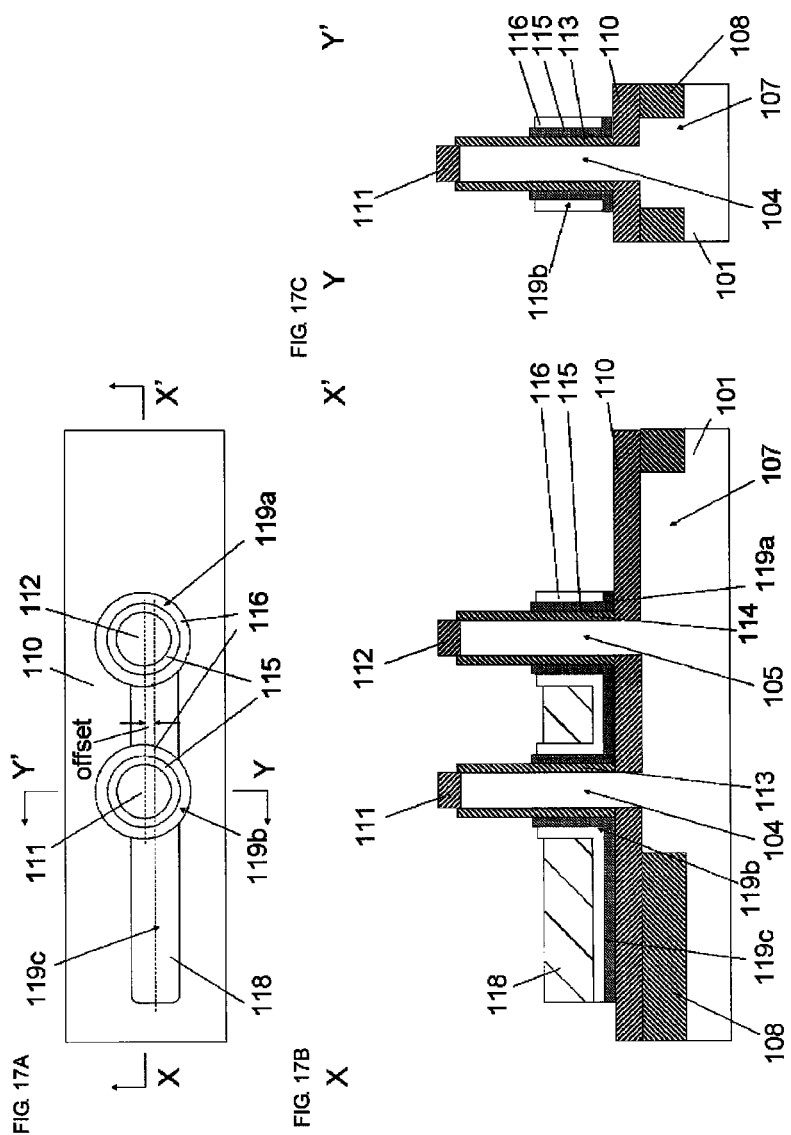

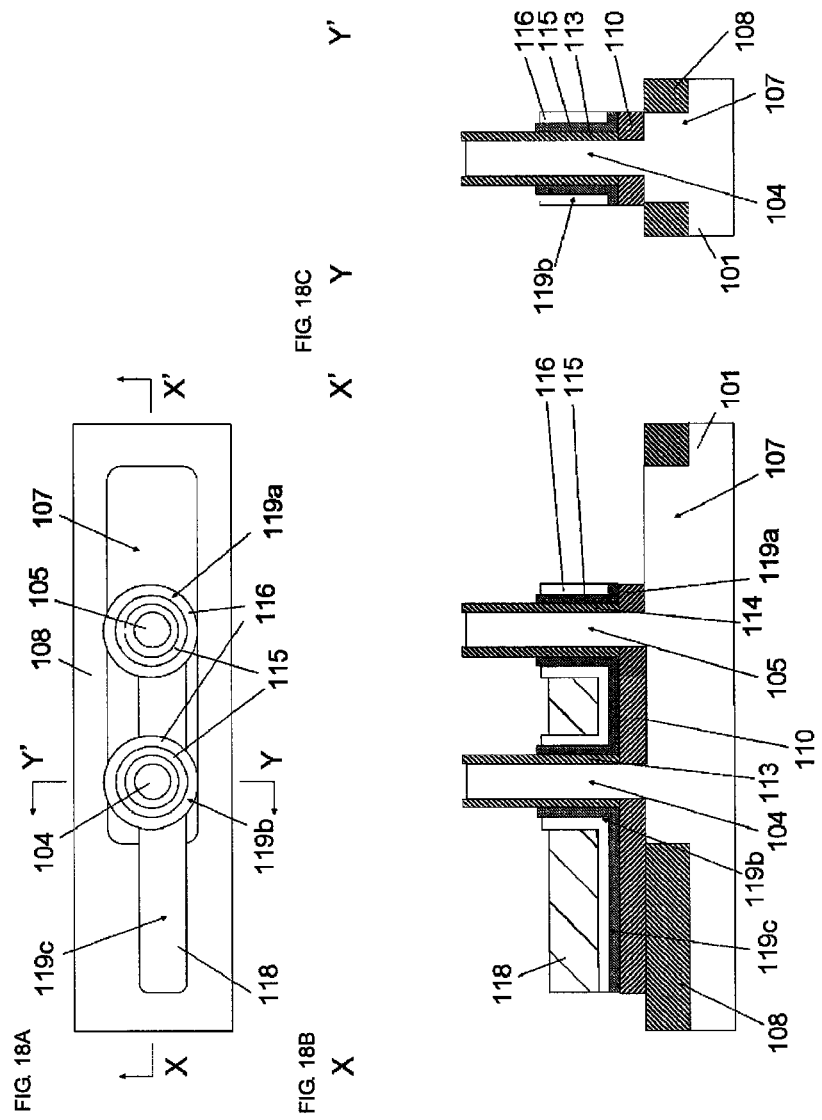

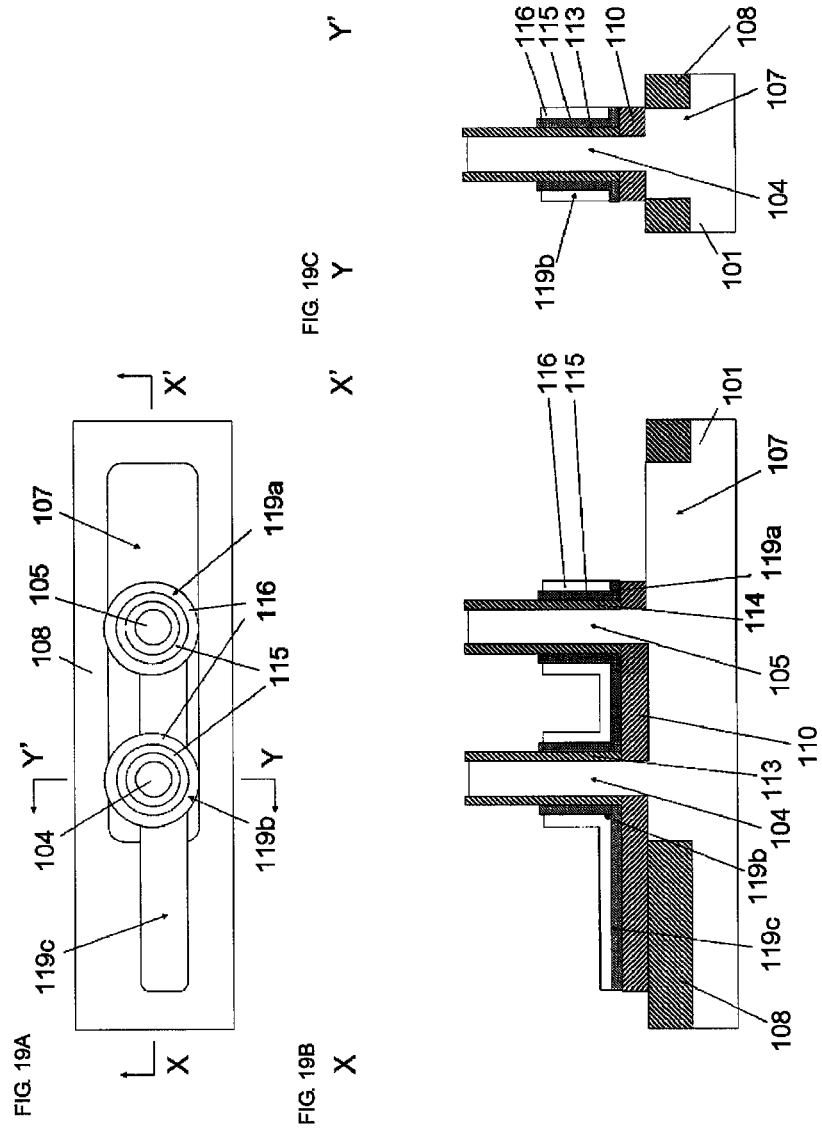

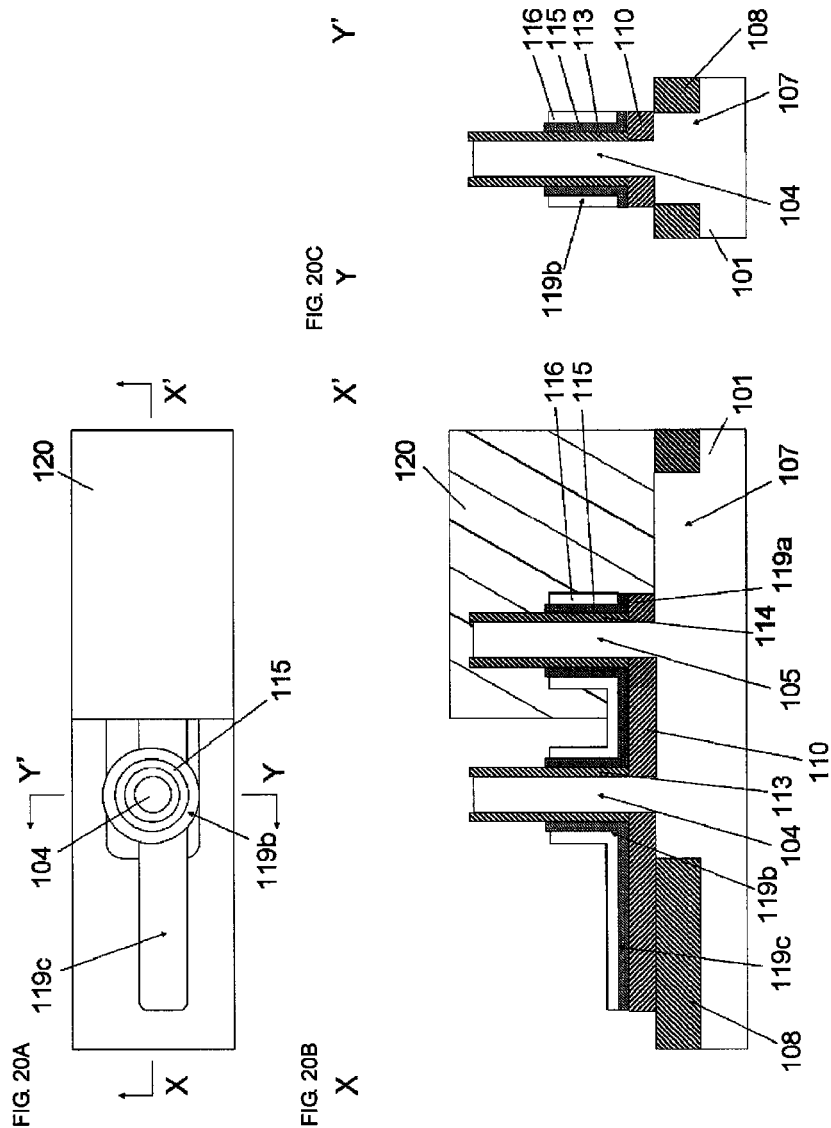

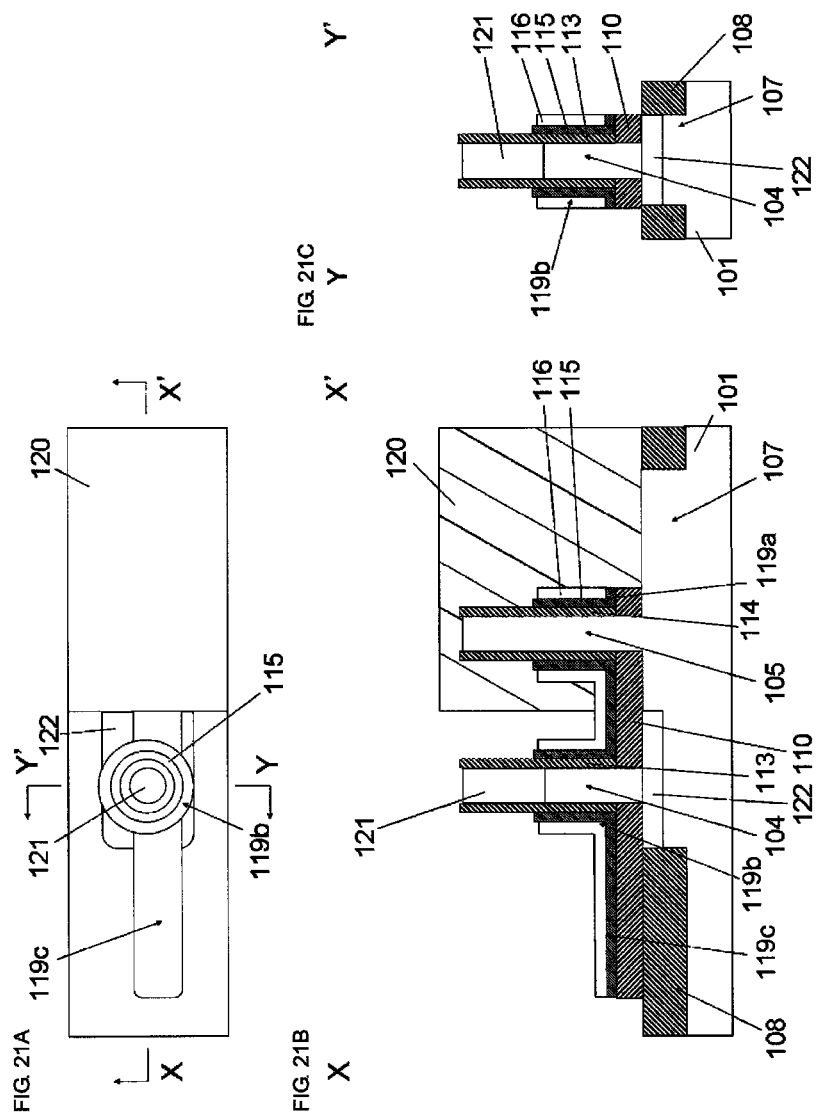

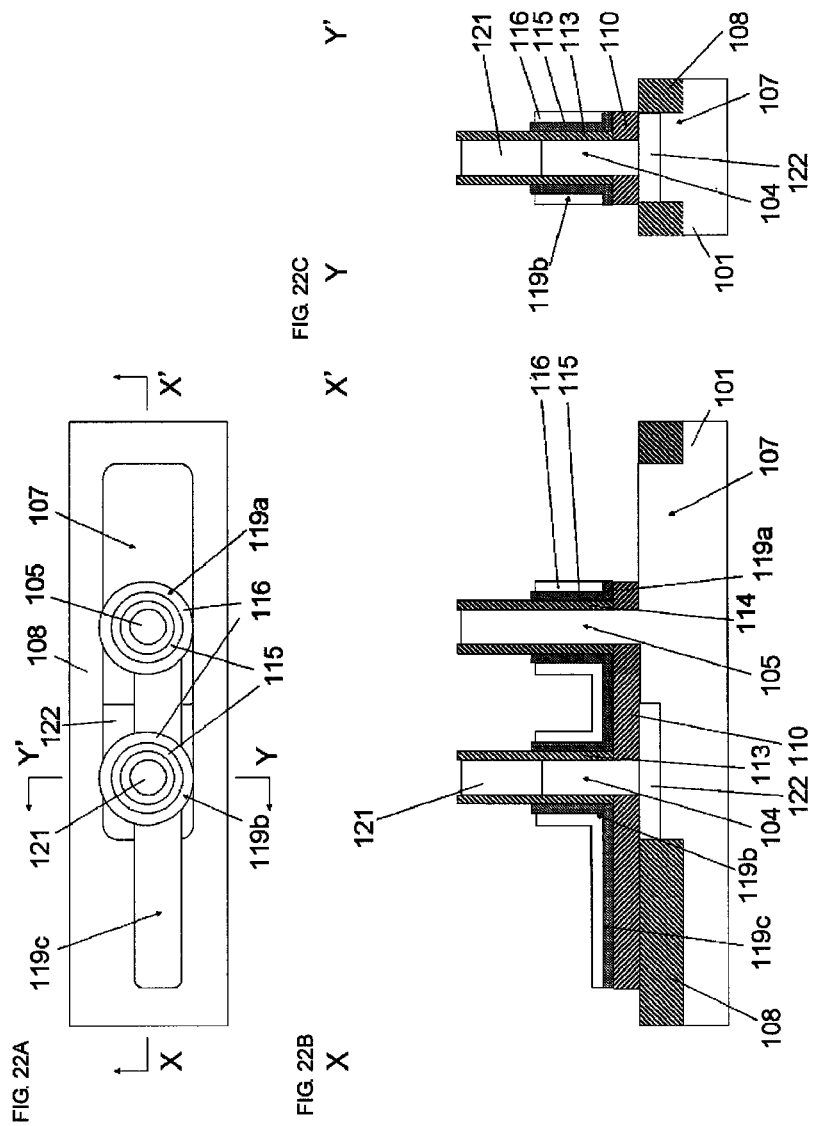

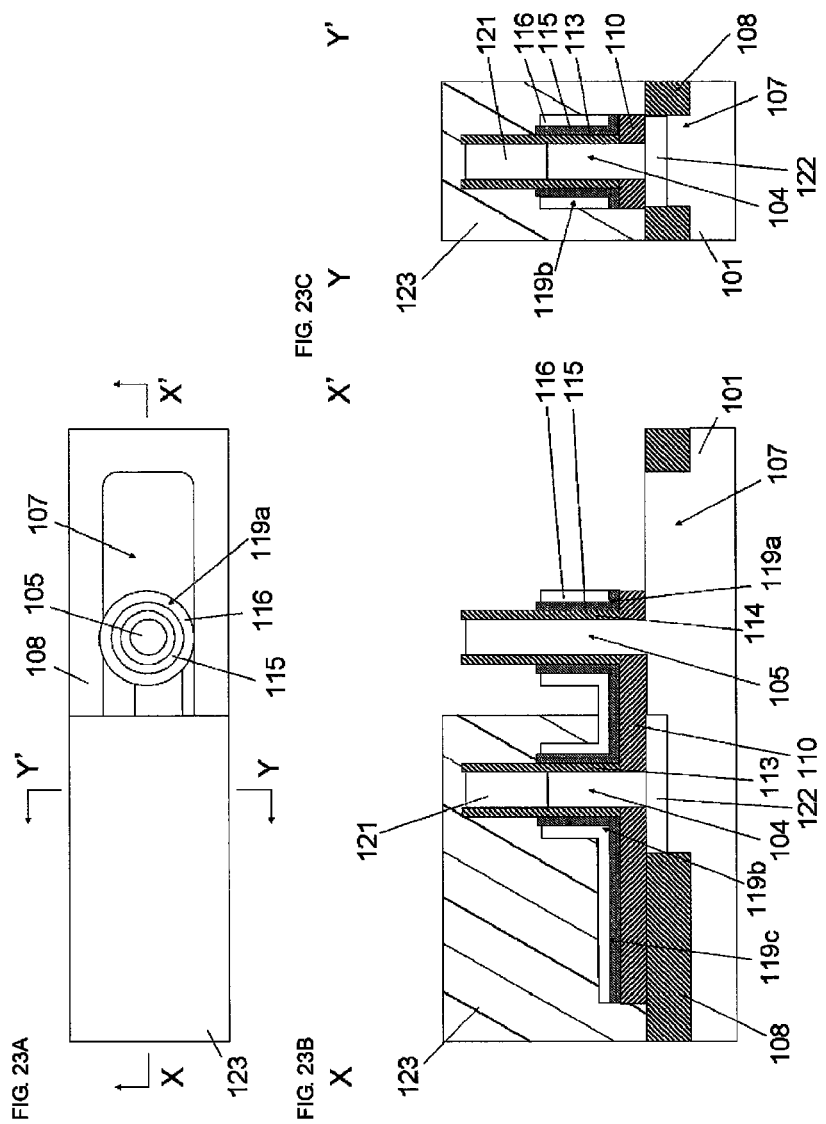

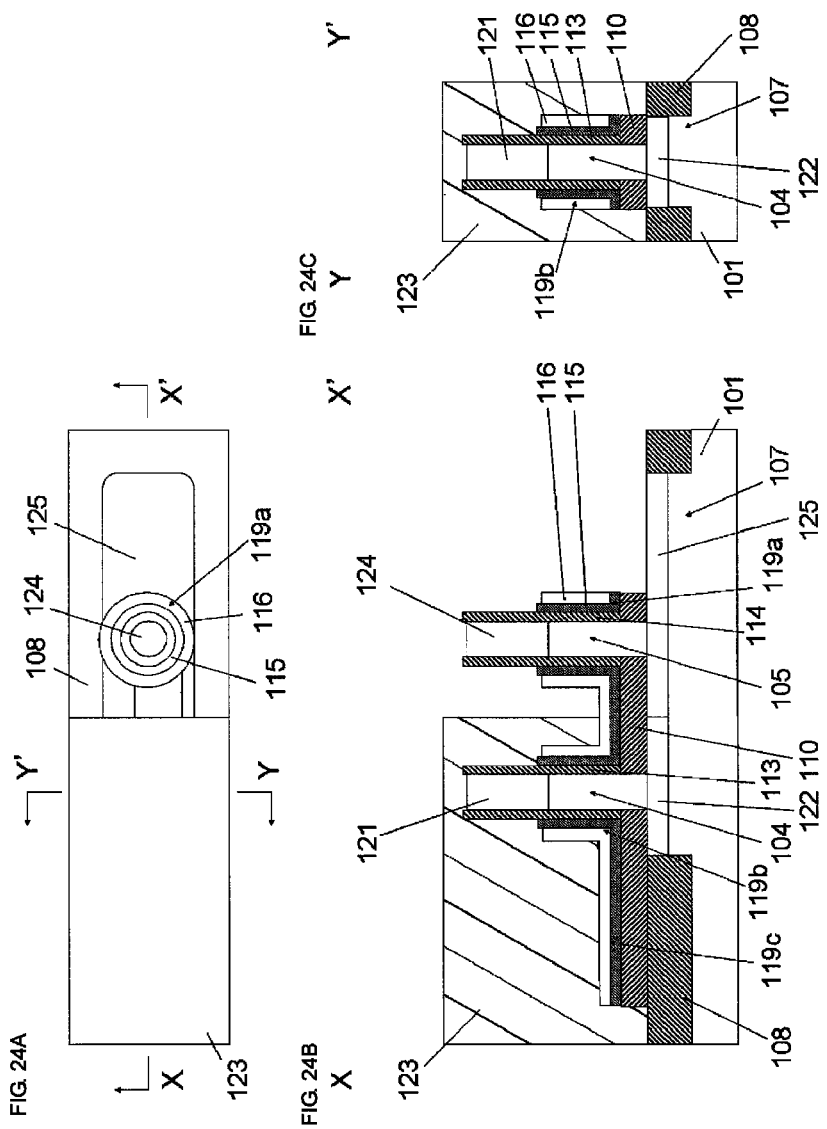

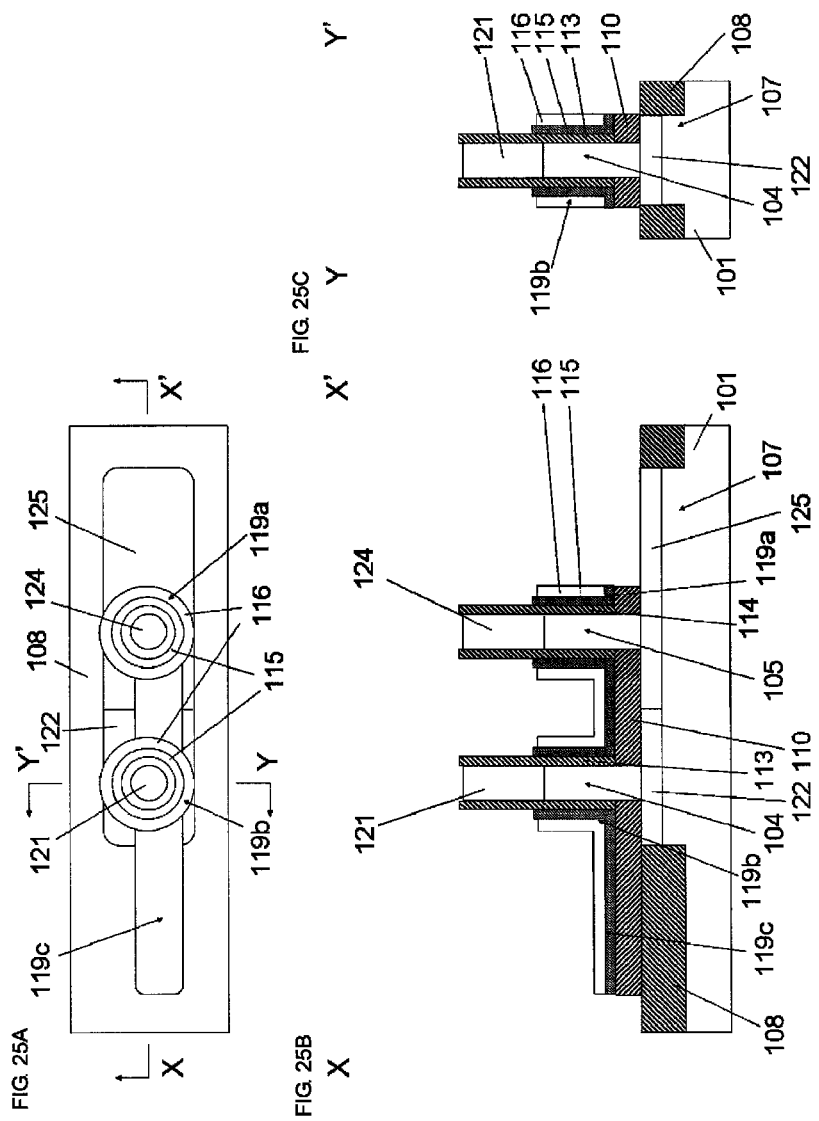

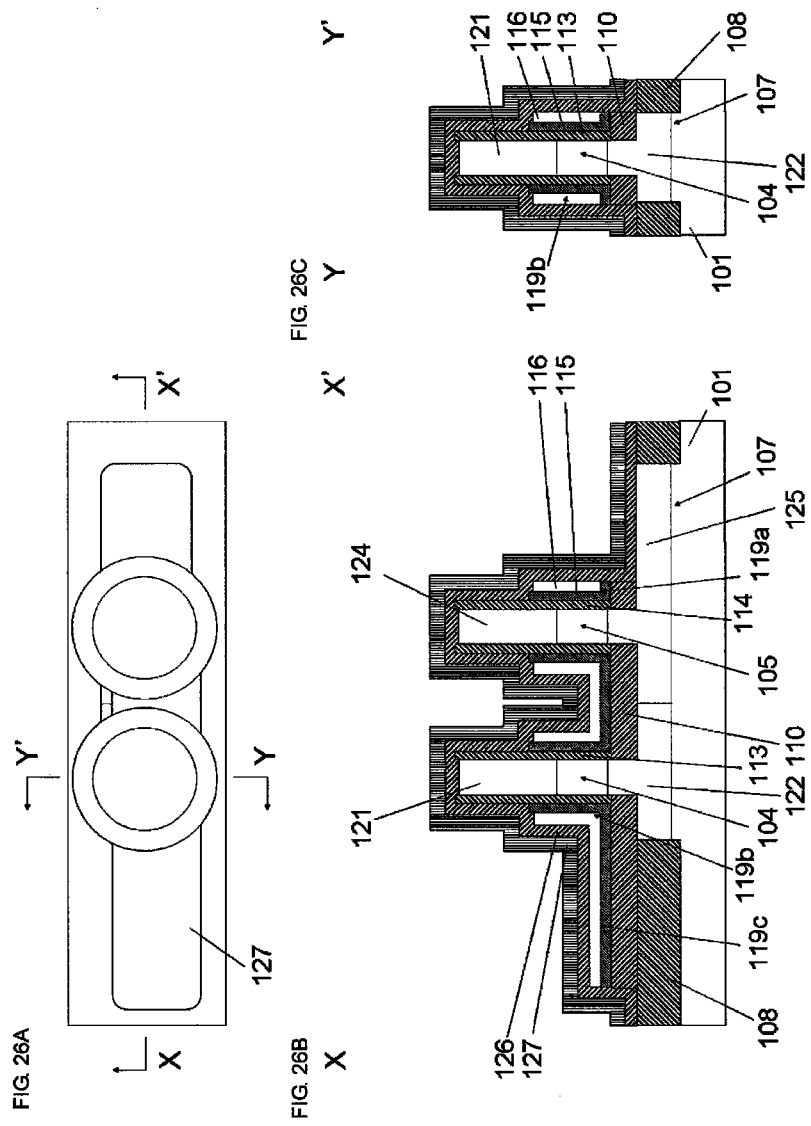

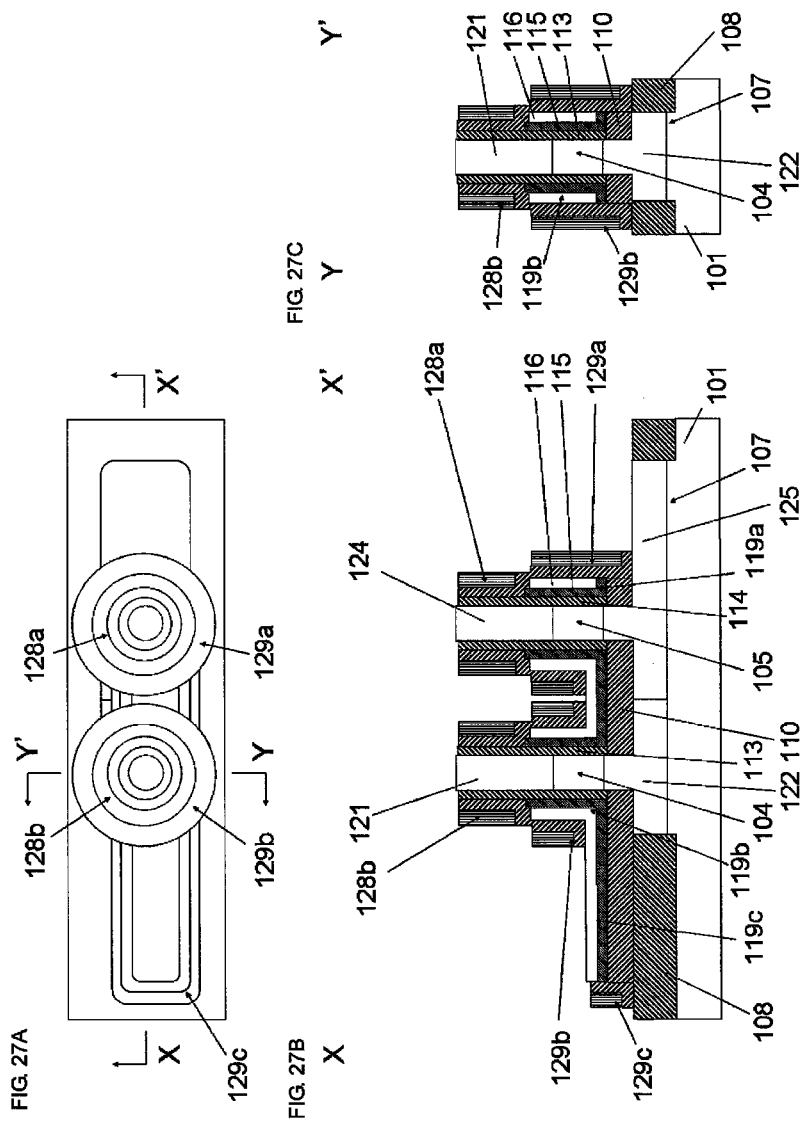

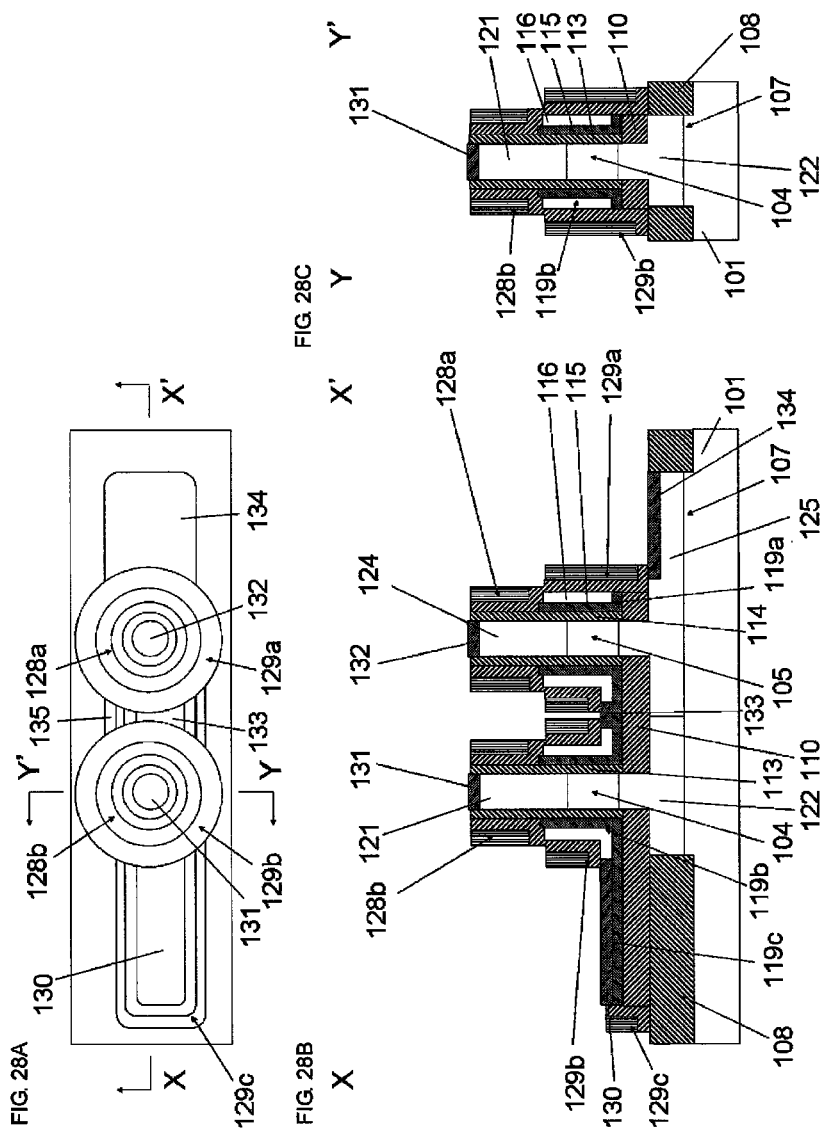

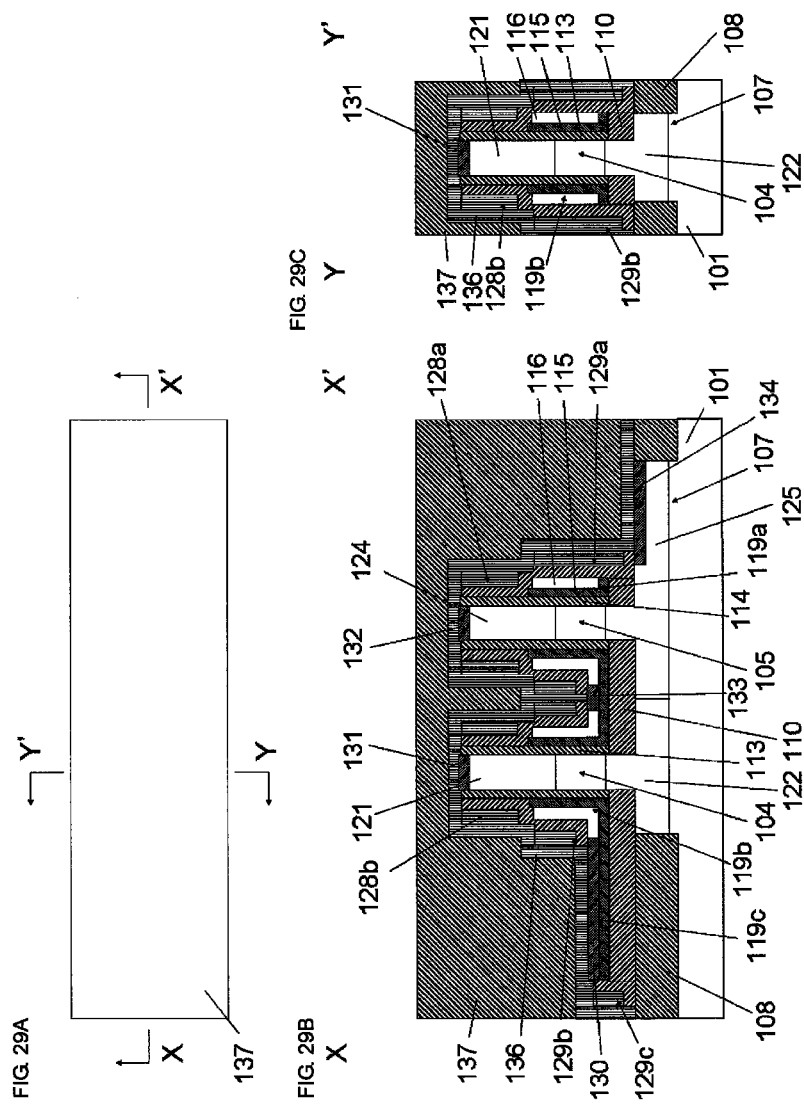

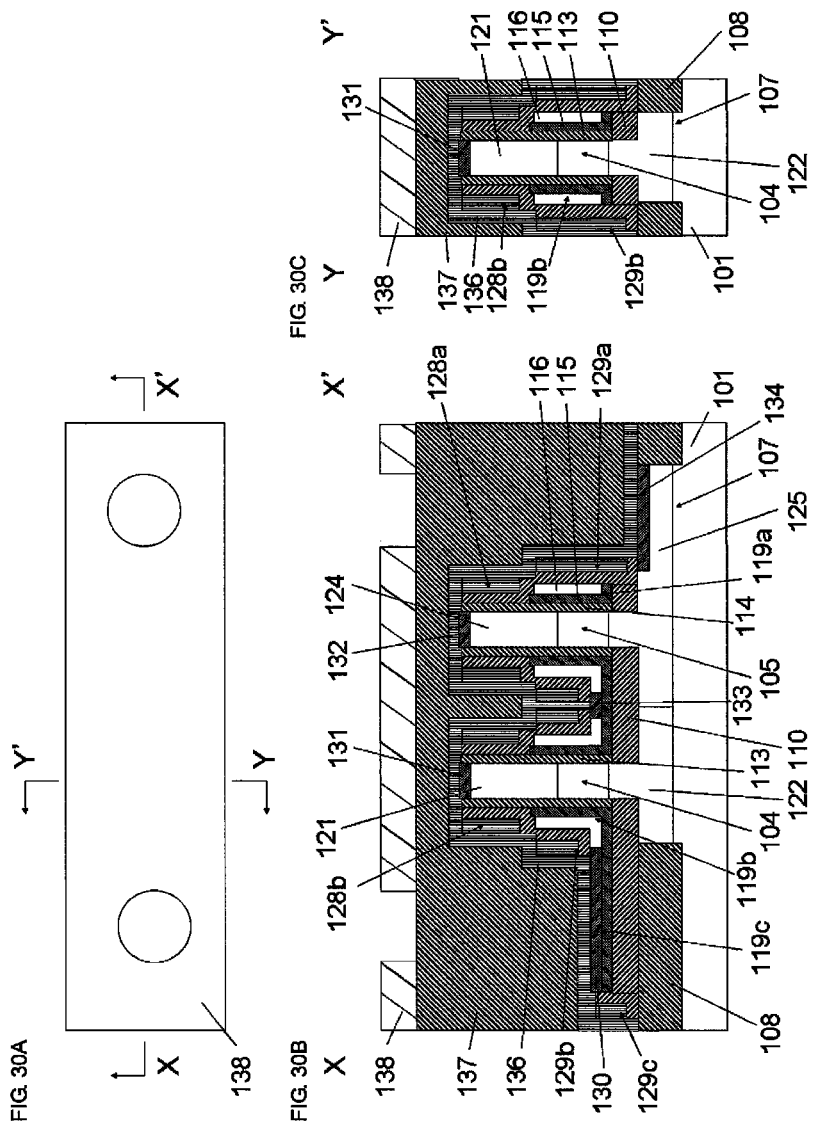

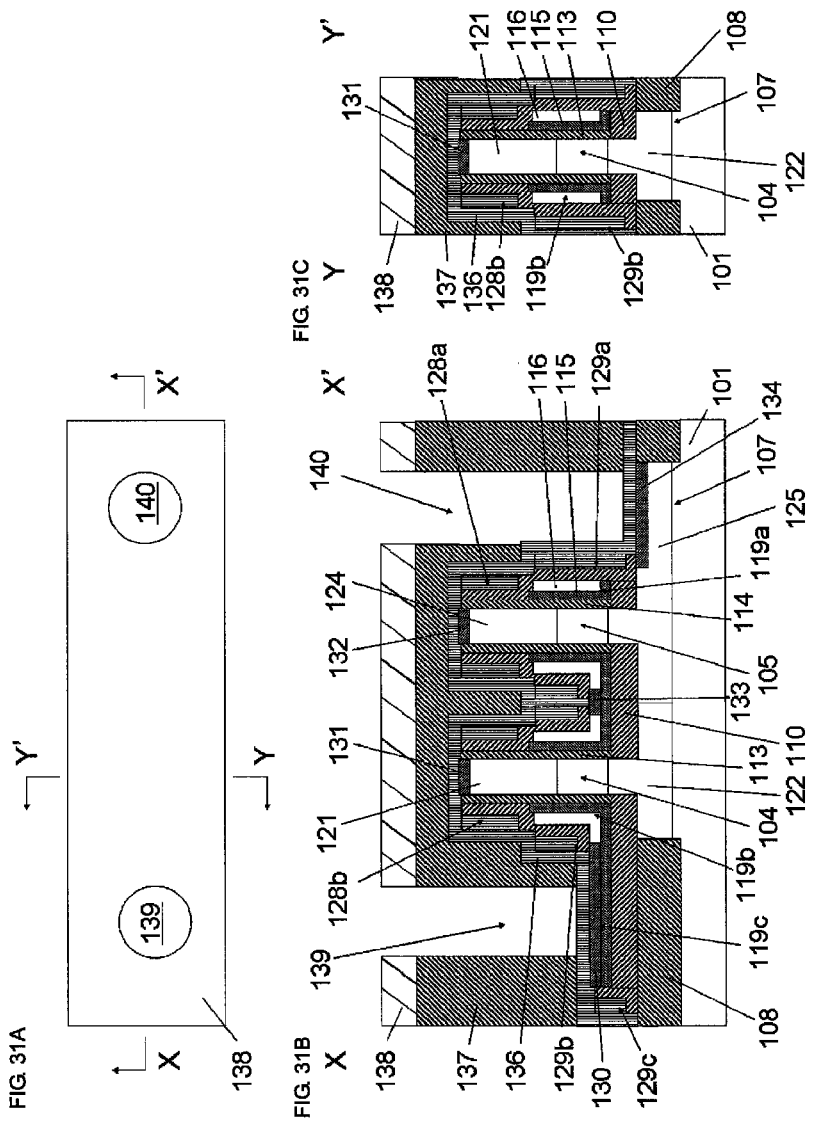

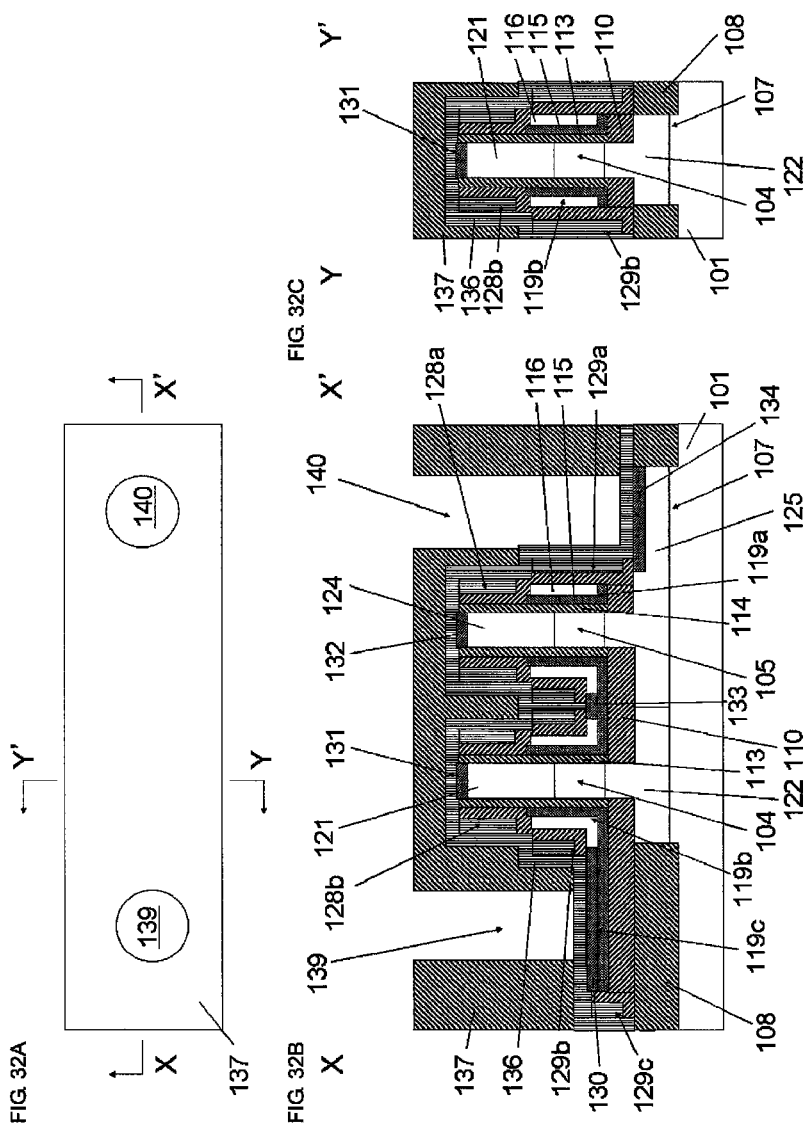

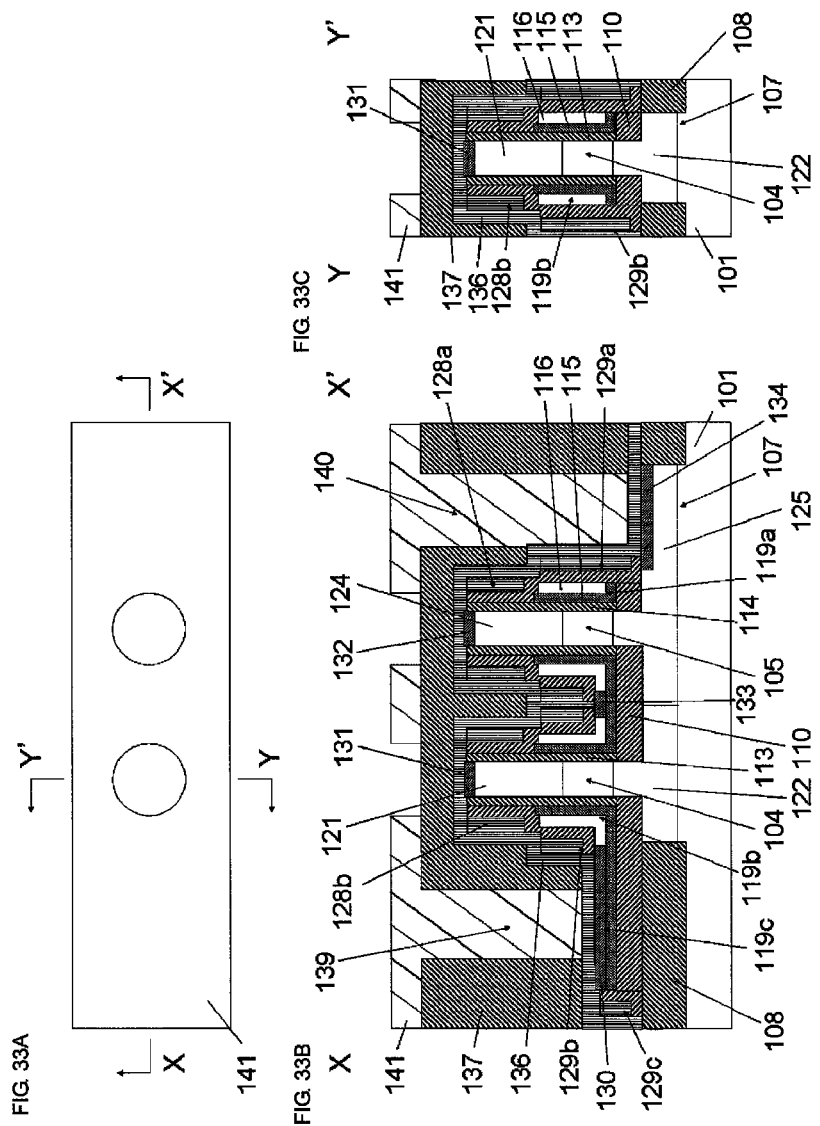

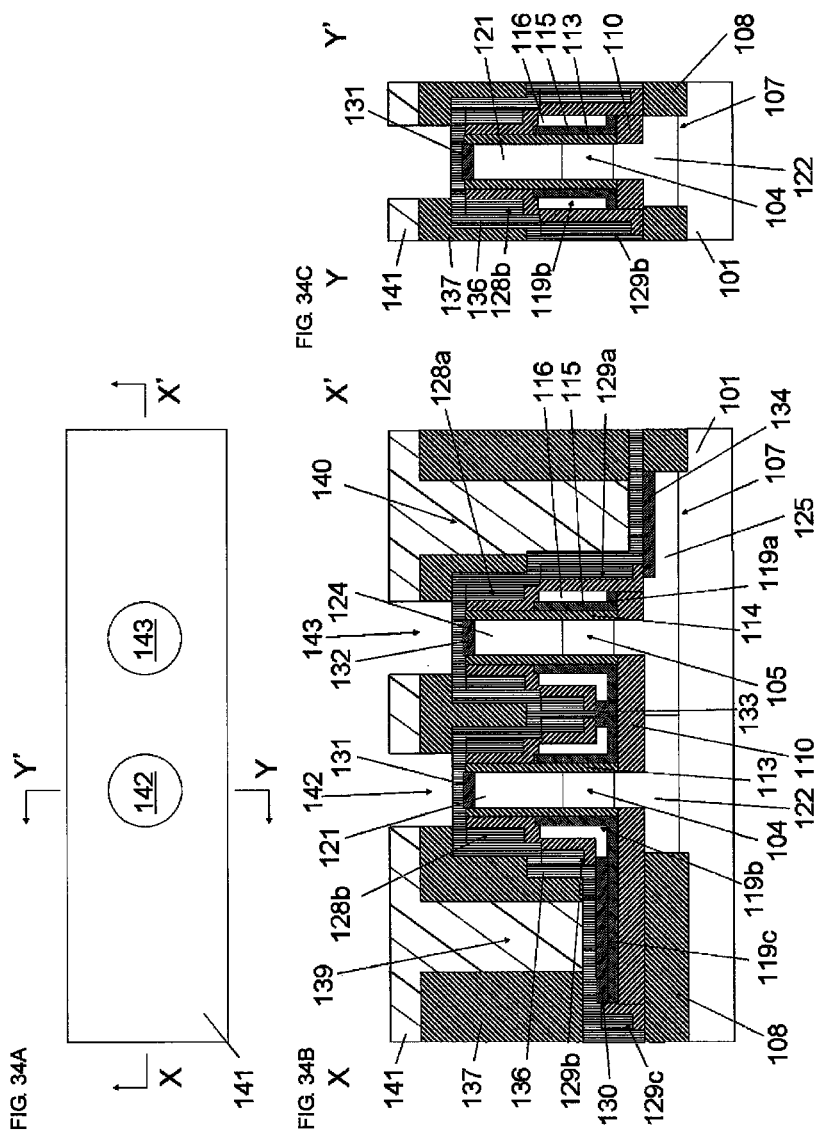

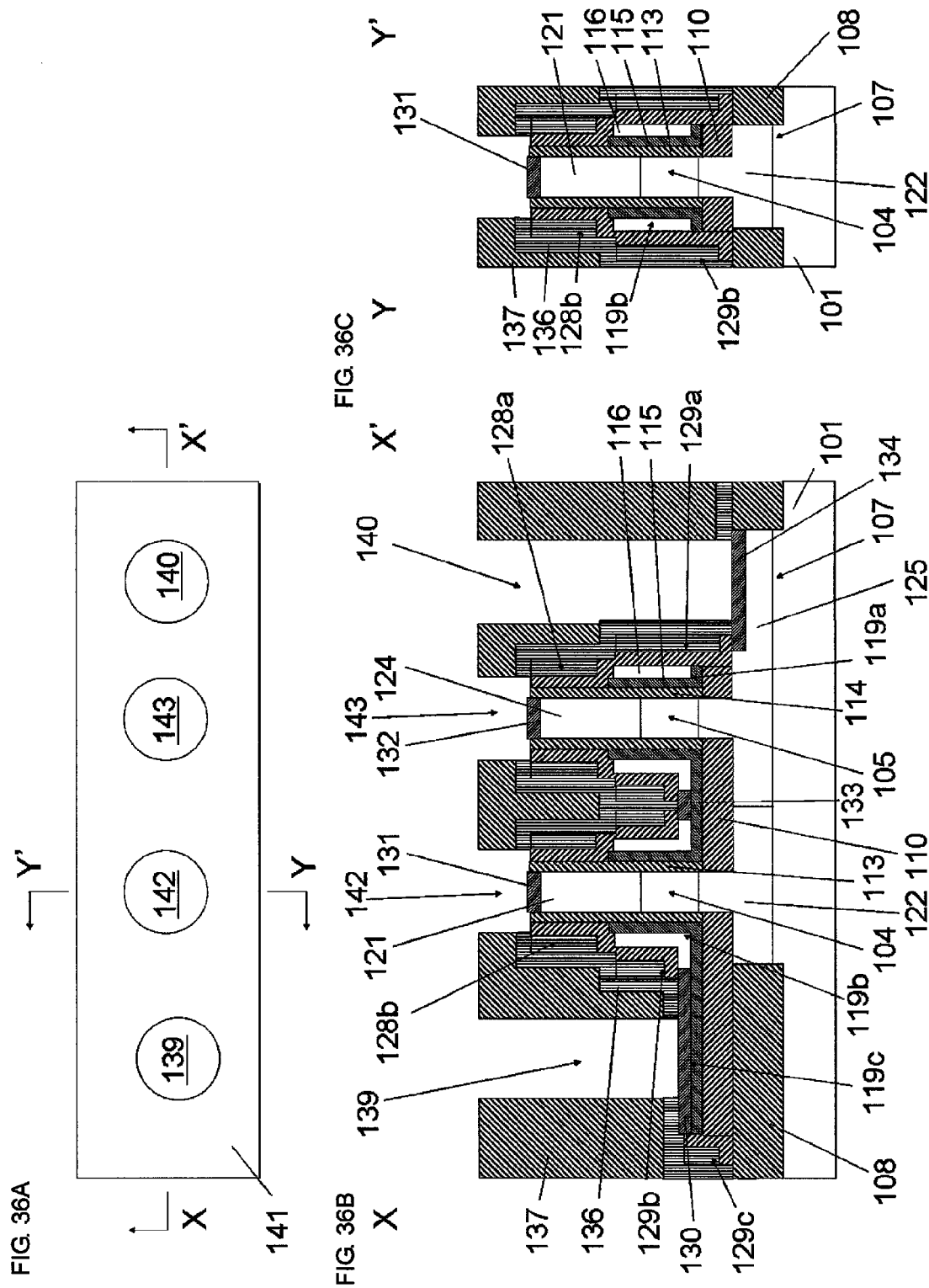

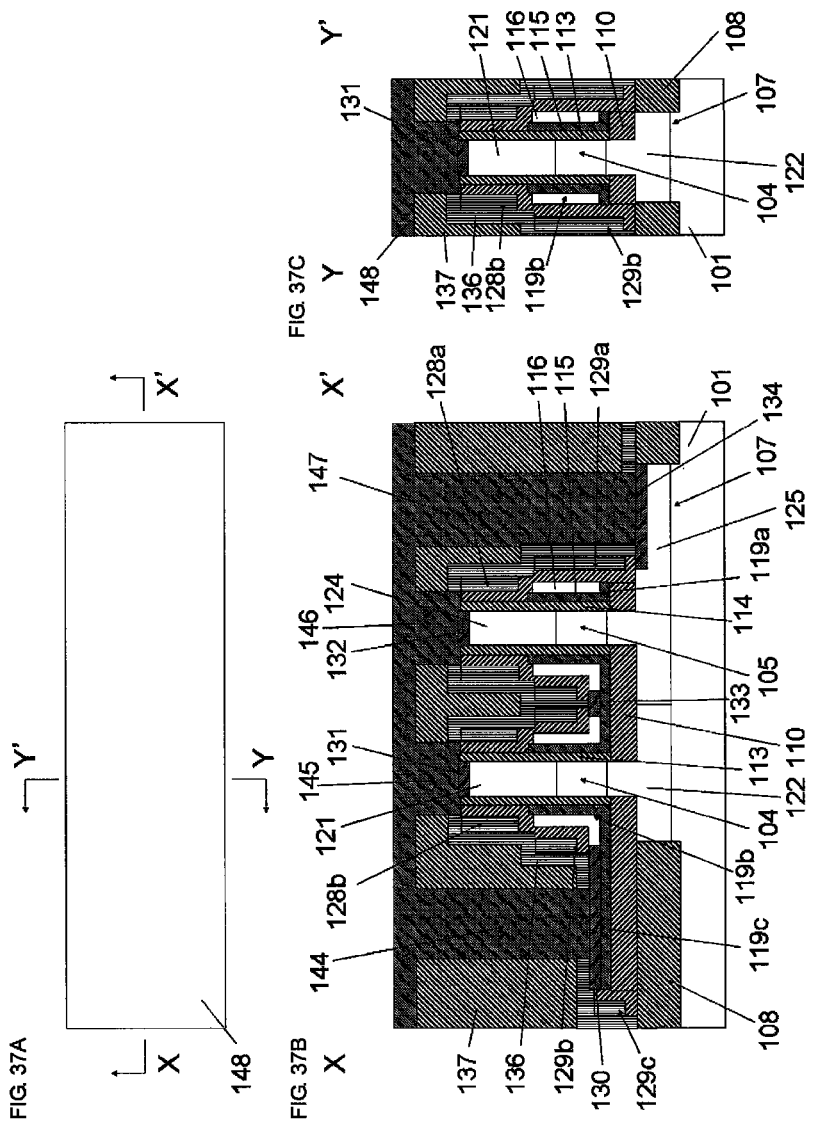

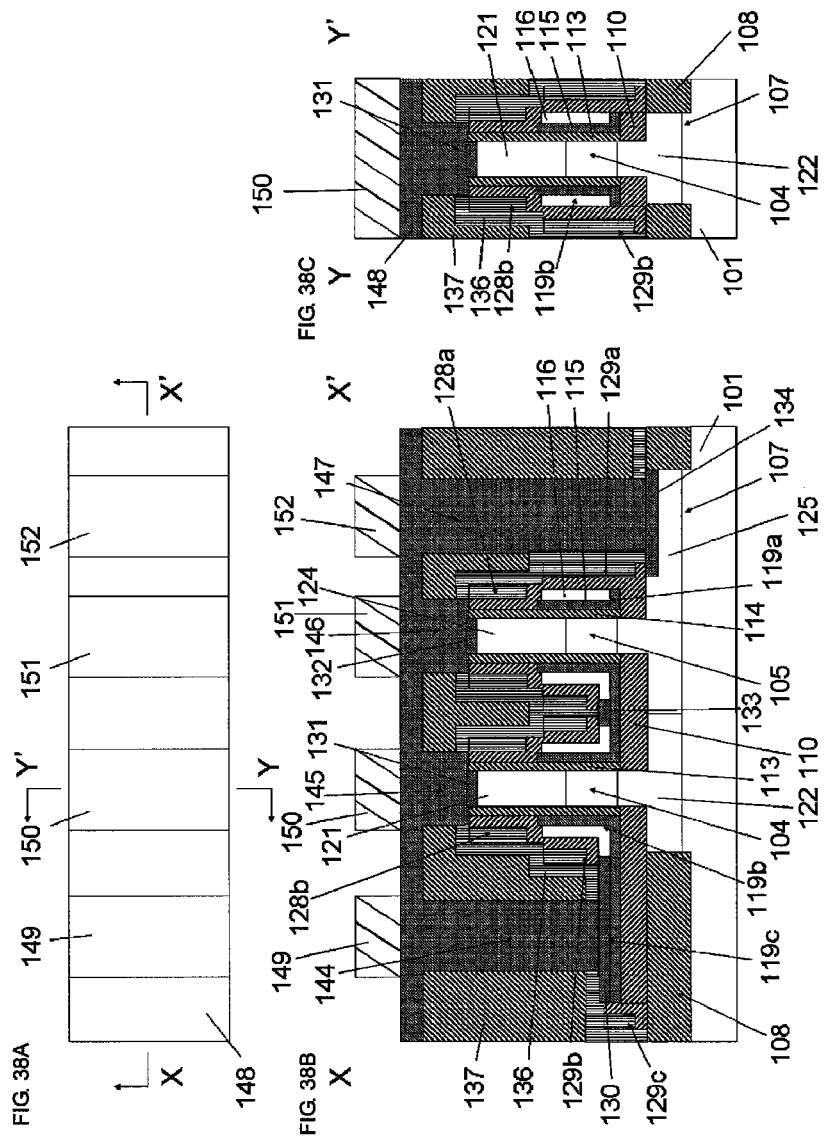

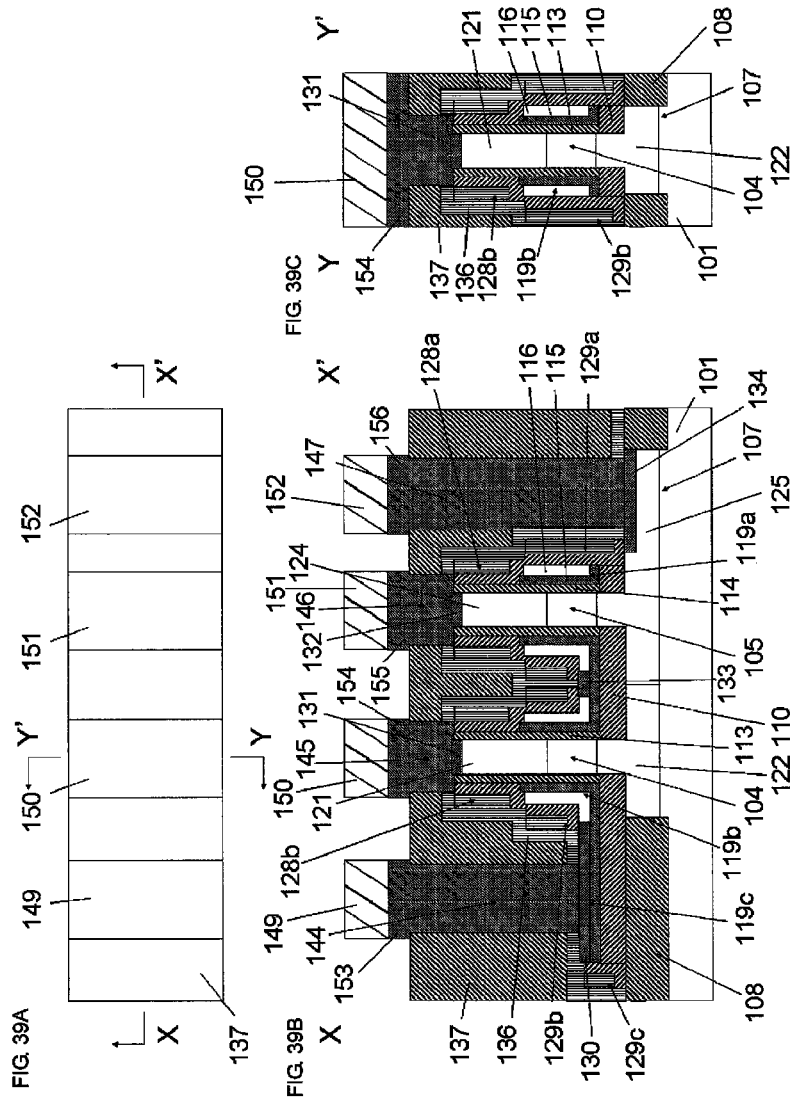

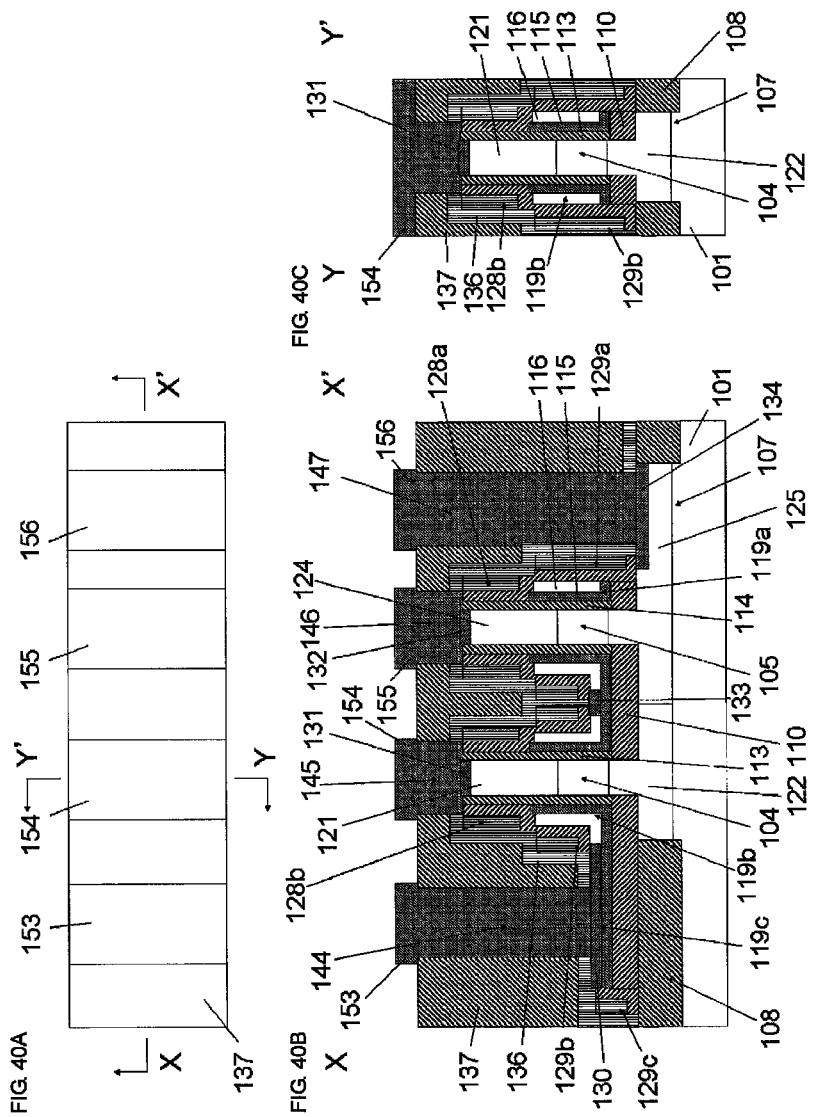

SEMICONDUCTOR DEVICE PRODUCTION METHOD AND SEMICONDUCTOR DEVICE

CROSS REFERENCES TO RELATED APPLICATIONS

The present application is a continuation application of PCT/JP2013/061653, filed Apr. 19, 2013, the contents of which are incorporated herein by reference in their entirety.

BACKGROUND OF THE INVENTION

1. Field of the Invention

The present invention relates to a semiconductor device production method and a semiconductor device.

2. Description of the Related Art

The degree of integration of semiconductor integrated circuits, in particular, integrated circuits that use MOS transistors, continues to increase. With the increase in the degree of integration, MOS transistors used in the circuits have been miniaturized to a nanometer scale. With miniaturization of MOS transistors, issues have arisen in that reducing leakage current has become difficult and decreasing the area occupied by circuits has become difficult due to need of securing the required amount of current. In order to address these issues, a surrounding gate transistor (hereinafter referred to as an "SGT") has been proposed in which a source, a gate, and a drain are arranged in a direction perpendicular to a substrate and a gate electrode surrounds a pillar-shaped semiconductor layer (for example, refer to Japanese Unexamined Patent Application Publication No. 2-71556, Japanese Unexamined Patent Application Publication No. 2-188966, and Japanese Unexamined Patent Application Publication No. 3-145761).

According to an SGT production method of related art, a silicon pillar with a pillar-shaped nitride film hard mask is formed, a diffusion layer is formed below the silicon pillar, and then a gate material is deposited. Subsequently, the gate material is planarized and etched back to form an insulating film side wall on side walls of the silicon pillar and the nitride film hard mask. Then a resist pattern for a gate line is formed, the gate material is etched, the nitride film hard mask is removed, and a diffusion layer is formed in an upper portion of the silicon pillar so as to produce an SGT (for example, refer to Japanese Unexamined Patent Application Publication No. 2009-182317).

As the distance between adjacent silicon pillars decreases, it becomes necessary to deposit a thick gate material between such silicon pillars and very small holes called voids are sometimes formed between the silicon pillars according to the above-mentioned method. If such voids are formed, holes are formed in the gate material after etch back. If an insulating film is subsequently deposited between the silicon pillars to form an insulating film side wall, the insulating film is deposited in the voids as well. Accordingly, it becomes difficult to process the gate material that lies between silicon pillars.

To address this, a technique that involves the following has been disclosed (for example, refer to B. Yang, K. D. Buddharaju, S. H. G. Teo, N. Singh, G. D. Lo, and D. L. Kwong, "Vertical Silicon-Nanowire Formation and Gate-All-Around MOSFET", IEEE Electron Device Letters, VOL. 29, No. 7, July 2008, pp 791-794): A gate oxide film is formed after formation of a silicon pillar. After a thin polysilicon is deposited, a resist for forming a gate line covering an upper portion of the silicon pillar is formed. The gate line is etched, a thick oxide film is deposited, an upper portion of the silicon pillar is exposed, and a thin polysilicon on the upper portion of the silicon pillar is removed. Lastly, the thick oxide film is removed by wet etching.

However, according to the related art, a technique that uses metal in gate electrodes is not demonstrated. Moreover, formation of a resist is necessary to form a gate line that covers the upper portion of the silicon pillar; since the resist covers the upper portion of the silicon pillar, the process is not a self-aligned process.

SUMMARY OF THE INVENTION

It is desirable to provide a method for producing a semiconductor device having an SGT structure, with which a gate electrode composed of a metal material is formed by a self-aligned process by using a thin gate material, and to provide an SGT structure obtained by the method.

A first aspect of the present invention provides a semiconductor device production method. The method includes a first step of forming a planar semiconductor layer on a semiconductor substrate and forming a first pillar-shaped semiconductor layer and a second pillar-shaped semiconductor layer on the planar semiconductor layer; after the first step, a second step of forming a gate insulating film around the first pillar-shaped semiconductor layer and the second pillar-shaped semiconductor layer, forming a metal film and a polysilicon film around the gate insulating film, controlling a thickness of the polysilicon film to be smaller than a half of a distance between the first pillar-shaped semiconductor layer and the second pillar-shaped semiconductor layer, and depositing a third resist, exposing the polysilicon film on side walls of upper portions of the first pillar-shaped semiconductor layer and the second pillar-shaped semiconductor layer, removing the exposed polysilicon film by etching, stripping the third resist, and removing the metal film by etching; and after the second step, a third step of forming a fourth resist for forming a gate line and performing anisotropic etching to form a gate line, a first gate electrode, and a second gate electrode.

Preferably, after the first step, a step of forming oxide film hard masks on the first pillar-shaped semiconductor layer and the second pillar-shaped semiconductor layer and forming an oxide film on the planar silicon layer, the oxide film being thicker than the gate insulating film is further contained.

Preferably, a height of an upper surface of the fourth resist is less than a height of an upper surface of the polysilicon film that has undergone the second step.

A fourth step of forming a first n-type diffusion layer in an upper portion of the first pillar-shaped semiconductor layer, forming a second n-type diffusion layer in a lower portion of the first pillar-shaped semiconductor layer and an upper portion of the planar semiconductor layer, forming a first p-type diffusion layer in an upper portion of the second pillar-shaped semiconductor layer, and forming a second p-type diffusion layer in a lower portion of the second pillar-shaped semiconductor layer and an upper portion of the planar semiconductor layer is preferably further contained.

A fifth step of forming silicides on the first n-type diffusion layer, the second n-type diffusion layer, the first p-type diffusion layer, the second p-type diffusion layer, and the gate line is preferably further contained.

A second aspect of the present invention provides a semiconductor device that includes a planar semiconductor layer formed on a semiconductor substrate; first and second pillar-shaped semiconductor layers formed on the planar semiconductor layer; a first gate insulating film formed around the first pillar-shaped semiconductor layer; a first gate electrode having a laminated structure constituted by a metal film and a polysilicon film formed around the first gate insulating film; a second gate insulating film formed around the second pillar-shaped semiconductor layer; a second gate electrode having a laminated structure constituted by a metal film and a polysilicon film formed around the second gate insulating film; a gate line connected to the first and second gate electrodes; an oxide film formed between the gate line and the planar semiconductor layer and having a thickness larger than that of the gate insulating film; a first n-type diffusion layer formed in an upper portion of the first pillar-shaped semiconductor layer; a second n-type diffusion layer formed in a lower portion of the first pillar-shaped semiconductor layer and an upper portion of the planar semiconductor layer; a first p-type diffusion layer formed in an upper portion of the second pillar-shaped semiconductor layer; and a second p-type diffusion layer formed in a lower portion of the second pillar-shaped semiconductor layer and an upper portion of the planar semiconductor layer.

A thickness of the polysilicon film is preferably smaller than a half of a distance between the first pillar-shaped semiconductor layer and the second pillar-shaped semiconductor layer.

A height of an upper surface of the metal film is preferably more than a height of an upper surface of the polysilicon film.

A height of an upper surface of the gate line is preferably less than a height of upper surfaces of the first and second gate electrodes.

The gate line preferably has a laminated structure constituted by the metal film and a silicide.

Preferably, there is a particular offset between a center line of the gate line and a line that connects a center point of the first pillar-shaped semiconductor layer and a center point of the second pillar-shaped semiconductor layer.

Preferably, silicides formed on the first and second n-type diffusion layers and the first and second p-type diffusion layers are further included.

The present invention provides a metal-gate SGT production method through a self-aligned process that uses a thin gate material, and an SGT structure obtained by this method.

BRIEF DESCRIPTION OF THE DRAWINGS

FIG. 1A is a plan view of a semiconductor device according to an embodiment of the present invention, FIG. 1B is a cross-sectional view taken along line X-X' in FIG. 1A, and FIG. 1C is a cross-sectional view taken along line Y-Y' in FIG. 1A.

FIG. 2A is a plan view showing a semiconductor device production method according to this embodiment, FIG. 2B is a cross-sectional view taken along line X-X' in FIG. 2A, and FIG. 2C is a cross-sectional view taken along line Y-Y' in FIG. 2A.

FIG. 3A is a plan view showing a semiconductor device production method according to this embodiment, FIG. 3B is a cross-sectional view taken along line X-X' in FIG. 3A, and FIG. 3C is a cross-sectional view taken along line Y-Y' in FIG. 3A.

FIG. 4A is a plan view showing a semiconductor device production method according to this embodiment, FIG. 4B is a cross-sectional view taken along line X-X' in FIG. 4A, and FIG. 4C is a cross-sectional view taken along line Y-Y' in FIG. 4A.

FIG. 5A is a plan view showing a semiconductor device production method according to this embodiment, FIG. 5B is a cross-sectional view taken along line X-X' in FIG. 5A, and FIG. 5C is a cross-sectional view taken along line Y-Y' in FIG. 5A.

FIG. 6A is a plan view showing a semiconductor device production method according to this embodiment, FIG. 6B is a cross-sectional view taken along line X-X' in FIG. 6A, and FIG. 6C is a cross-sectional view taken along line Y-Y' in FIG. 6A.

FIG. 7A is a plan view showing a semiconductor device production method according to this embodiment, FIG. 7B is a cross-sectional view taken along line X-X' in FIG. 7A, and FIG. 7C is a cross-sectional view taken along line Y-Y' in FIG. 7A.

FIG. 8A is a plan view showing a semiconductor device production method according to this embodiment, FIG. 8B is a cross-sectional view taken along line X-X' in FIG. 8A, and FIG. 8C is a cross-sectional view taken along line Y-Y' in FIG. 8A.

FIG. 9A is a plan view showing a semiconductor device production method according to this embodiment, FIG. 9B is a cross-sectional view taken along line X-X' in FIG. 9A, and FIG. 9C is a cross-sectional view taken along line Y-Y' in FIG. 9A.

FIG. 10A is a plan view showing a semiconductor device production method according to this embodiment, FIG. 10B is a cross-sectional view taken along line X-X' in FIG. 10A, and FIG. 10C is a cross-sectional view taken along line Y-Y' in FIG. 10A.

FIG. 11A is a plan view showing a semiconductor device production method according to this embodiment, FIG. 11B is a cross-sectional view taken along line X-X' in FIG. 11A, and FIG. 11C is a cross-sectional view taken along line Y-Y' in FIG. 11A.

FIG. 12A is a plan view showing a semiconductor device production method according to this embodiment, FIG. 12B is a cross-sectional view taken along line X-X' in FIG. 12A, and FIG. 12C is a cross-sectional view taken along line Y-Y' in FIG. 12A.

FIG. 13A is a plan view showing a semiconductor device production method according to this embodiment, FIG. 13B is a cross-sectional view taken along line X-X' in FIG. 13A, and FIG. 13C is a cross-sectional view taken along line Y-Y' in FIG. 13A.

FIG. 14A is a plan view showing a semiconductor device production method according to this embodiment, FIG. 14B is a cross-sectional view taken along line X-X' in FIG. 14A, and FIG. 14C is a cross-sectional view taken along line Y-Y' in FIG. 14A.

FIG. 15A is a plan view showing a semiconductor device production method according to this embodiment, FIG. 15B is a cross-sectional view taken along line X-X' in FIG. 15A, and FIG. 15C is a cross-sectional view taken along line Y-Y' in FIG. 15A.

FIG. 16A is a plan view showing a semiconductor device production method according to this embodiment, FIG. 16B is a cross-sectional view taken along line X-X' in FIG. 16A, and FIG. 16C is a cross-sectional view taken along line Y-Y' in FIG. 16A.

FIG. 17A is a plan view showing a semiconductor device production method according to this embodiment, FIG. 17B is a cross-sectional view taken along line X-X' in FIG. 17A, and FIG. 17C is a cross-sectional view taken along line Y-Y' in FIG. 17A.

FIG. 18A is a plan view showing a semiconductor device production method according to this embodiment, FIG. 18B is a cross-sectional view taken along line X-X' in FIG. 18A, and FIG. 18C is a cross-sectional view taken along line Y-Y' in FIG. 18A.

FIG. 19A is a plan view showing a semiconductor device production method according to this embodiment, FIG. 19B is a cross-sectional view taken along line X-X' in FIG. 19A, and FIG. 19C is a cross-sectional view taken along line Y-Y' in FIG. 19A.

FIG. 20A is a plan view showing a semiconductor device production method according to this embodiment, FIG. 20B is a cross-sectional view taken along line X-X' in FIG. 20A, and FIG. 20C is a cross-sectional view taken along line Y-Y' in FIG. 20A.

FIG. 21A is a plan view showing a semiconductor device production method according to this embodiment, FIG. 21B is a cross-sectional view taken along line X-X' in FIG. 21A, and FIG. 21C is a cross-sectional view taken along line Y-Y' in FIG. 21A.

FIG. 22A is a plan view showing a semiconductor device production method according to this embodiment, FIG. 22B is a cross-sectional view taken along line X-X' in FIG. 22A, and FIG. 22C is a cross-sectional view taken along line Y-Y' in FIG. 22A.

FIG. 23A is a plan view showing a semiconductor device production method according to this embodiment, FIG. 23B is a cross-sectional view taken along line X-X' in FIG. 23A, and FIG. 23C is a cross-sectional view taken along line Y-Y' in FIG. 23A.

FIG. 24A is a plan view showing a semiconductor device production method according to this embodiment, FIG. 24B is a cross-sectional view taken along line X-X' in FIG. 24A, and FIG. 24C is a cross-sectional view taken along line Y-Y' in FIG. 24A.

FIG. 25A is a plan view showing a semiconductor device production method according to this embodiment, FIG. 25B is a cross-sectional view taken along line X-X' in FIG. 25A, and FIG. 25C is a cross-sectional view taken along line Y-Y' in FIG. 25A.

FIG. 26A is a plan view showing a semiconductor device production method according to this embodiment, FIG. 26B is a cross-sectional view taken along line X-X' in FIG. 26A, and FIG. 26C is a cross-sectional view taken along line Y-Y' in FIG. 26A.

FIG. 27A is a plan view showing a semiconductor device production method according to this embodiment, FIG. 27B is a cross-sectional view taken along line X-X' in FIG. 27A, and FIG. 27C is a cross-sectional view taken along line Y-Y' in FIG. 27A.

FIG. 28A is a plan view showing a semiconductor device production method according to this embodiment, FIG. 28B is a cross-sectional view taken along line X-X' in FIG. 28A, and FIG. 28C is a cross-sectional view taken along line Y-Y' in FIG. 28A.

FIG. 29A is a plan view showing a semiconductor device production method according to this embodiment, FIG. 29B is a cross-sectional view taken along line X-X' in FIG. 29A, and FIG. 29C is a cross-sectional view taken along line Y-Y' in FIG. 29A.

FIG. 30A is a plan view showing a semiconductor device production method according to this embodiment, FIG. 30B is a cross-sectional view taken along line X-X' in FIG. 30A, and FIG. 30C is a cross-sectional view taken along line Y-Y' in FIG. 30A.

FIG. 31A is a plan view showing a semiconductor device production method according to this embodiment, FIG. 31B is a cross-sectional view taken along line X-X' in FIG. 31A, and FIG. 31C is a cross-sectional view taken along line Y-Y' in FIG. 31A.

FIG. 32A is a plan view showing a semiconductor device production method according to this embodiment, FIG. 32B is a cross-sectional view taken along line X-X' in FIG. 32A, and FIG. 32C is a cross-sectional view taken along line Y-Y' in FIG. 32A.

FIG. 33A is a plan view showing a semiconductor device production method according to this embodiment, FIG. 33B is a cross-sectional view taken along line X-X' in FIG. 33A, and FIG. 33C is a cross-sectional view taken along line Y-Y' in FIG. 33A.

FIG. 34A is a plan view showing a semiconductor device production method according to this embodiment, FIG. 34B is a cross-sectional view taken along line X-X' in FIG. 34A, and FIG. 34C is a cross-sectional view taken along line Y-Y' in FIG. 34A.

FIG. 36A is a plan view showing a semiconductor device production method according to this embodiment, FIG. 36B is a cross-sectional view taken along line X-X' in FIG. 36A, and FIG. 36C is a cross-sectional view taken along line Y-Y' in FIG. 36A.

FIG. 37A is a plan view showing a semiconductor device production method according to this embodiment, FIG. 37B is a cross-sectional view taken along line X-X' in FIG. 37A, and FIG. 37C is a cross-sectional view taken along line Y-Y' in FIG. 37A.

FIG. 38A is a plan view showing a semiconductor device production method according to this embodiment, FIG. 38B is a cross-sectional view taken along line X-X' in FIG. 38A, and FIG. 38C is a cross-sectional view taken along line Y-Y' in FIG. 38A.

FIG. 39A is a plan view showing a semiconductor device production method according to this embodiment, FIG. 39B is a cross-sectional view taken along line X-X' in FIG. 39A, and FIG. 39C is a cross-sectional view taken along line Y-Y' in FIG. 39A.

FIG. 40A is a plan view showing a semiconductor device production method according to this embodiment, FIG. 40B is a cross-sectional view taken along line X-X' in FIG. 40A, and FIG. 40C is a cross-sectional view taken along line Y-Y' in FIG. 40A.

DESCRIPTION OF THE PREFERRED EMBODIMENTS

Figures 35A, 35B, 35C:
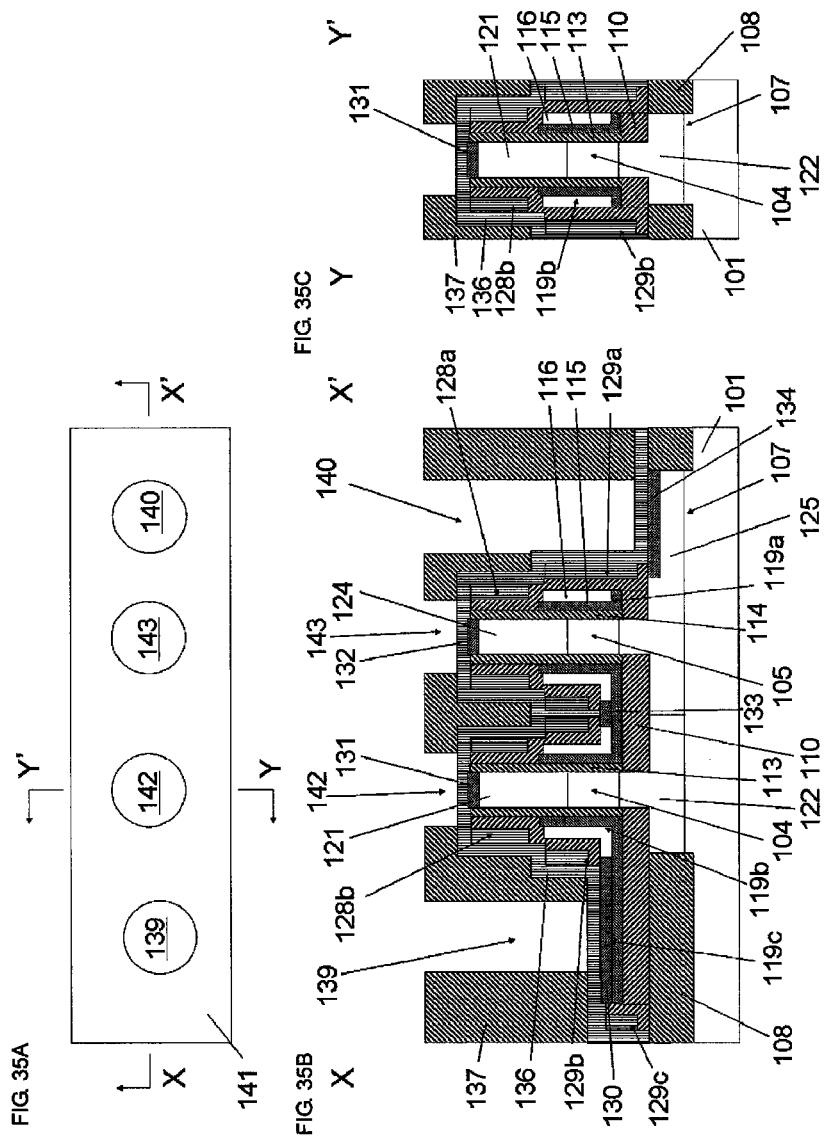
FIG. 35A is a plan view showing a semiconductor device production method according to this embodiment.
FIG. 35B is a cross-sectional view taken along line X-X' in FIG. 35A.
FIG. 35C is a cross-sectional view taken along line Y-Y' in FIG. 35A.

A semiconductor device having an SGT structure produced by a semiconductor device production method according to an embodiment of the present invention has the following structure.

As shown in FIGS. 1A to 1C, a semiconductor device that has an SGT structure according to this embodiment includes a planar silicon layer 107 formed on a silicon substrate 101, first and second pillar-shaped silicon layers 104 and 105 formed on the planar silicon layer 107, a gate insulating film 113 formed around the first pillar-shaped silicon layer 104, and a first gate electrode 119b having a laminated structure constituted by a metal film 115 and a polysilicon film 116 formed around the gate insulating film 113.

A gate insulating film 114, a second gate electrode 119a having a laminated structure constituted by the metal film 115 and the polysilicon film 116 formed around the gate insulating film 114, and a polysilicon film 116 are formed around the second pillar-shaped silicon layer 105.

The gate insulating film 114, the second gate electrode 119a having a laminated structure constituted by the metal film 115 and the polysilicon film 116 formed around the gate insulating film 114, and the polysilicon film 116 each have a thickness smaller than a half of a distance between the first pillar-shaped silicon layer 104 and the second pillar-shaped silicon layer 105; and the height of the upper surface of the metal film 115 is more than the height of the upper surface of the polysilicon film 116.

The height of the upper surface of a gate line 119c connected to the first and second gate electrodes 119b and 119a is less than the height of the upper surfaces of the first and second gate electrodes 119b and 119a.

The semiconductor device having an SGT structure according to this embodiment further includes a second oxide film 110 that is formed between the gate line 119c and the planar silicon layer 107 and has a thickness larger than that of the gate insulating films 113 and 114, a first n-type diffusion layer 121 formed in an upper portion of the first pillar-shaped silicon layer 104, a second n-type diffusion layer 122 formed in a lower portion of the first pillar-shaped silicon layer 104 and in an upper portion of the planar silicon layer 107, a first p-type diffusion layer 124 formed in an upper portion of the second pillar-shaped silicon layer 105, and a second p-type diffusion layer 125 formed in a lower portion of the second pillar-shaped silicon layer 105 and an upper portion of the planar silicon layer 107.

A method for producing a semiconductor device having an SGT structure according to an embodiment of the present invention will now be described with reference to FIGS. 2 to 40.

Provided below is a detailed description of a first step of forming a planar silicon layer 107 (planar semiconductor layer) on a silicon substrate 101 (semiconductor substrate), and forming a first pillar-shaped silicon layer 104 (first pillar-shaped semiconductor layer) and a second pillar-shaped silicon layer 105 (second pillar-shaped semiconductor layer) on the planar silicon layer 107.

As shown in FIGS. 2A to 2C, first, first resists 102 and 103 for forming a first pillar-shaped silicon layer 104 and a second pillar-shaped silicon layer 105 are formed on a silicon substrate 101. In this embodiment, a silicon substrate 101 is used as a substrate for forming a semiconductor device but the substrate may be any other substrate used in production of semiconductor devices.

Next, as shown in FIGS. 3A to 3C, the silicon substrate 101 is etched to form a first pillar-shaped silicon layer 104 and a second pillar-shaped silicon layer 105 under the first resists 102 and 103. Here, the pillar-shaped silicon layers are formed by using a hard mask such as an oxide film or a nitride film.

Subsequently, as shown in FIGS. 4A to 4C, the first resists 102 and 103 are stripped and removed.

Subsequently, as shown in FIGS. 5A to 5C, a second resist 106 for forming a planar silicon layer 107 is formed.

Subsequently, as shown in FIGS. 6A to 6C, the silicon substrate 101 is etched to form a planar silicon layer 107 under the second resist 106.

Subsequently, as shown in FIGS. 7A to 7C, the second resist 106 is stripped and removed.

Subsequently, as shown in FIGS. 8A to 8C, an element isolation film 108 is formed around the planar silicon layer 107.

Subsequently, as shown in FIGS. 9A to 9C, a first oxide film 109 is deposited so as to cover the first pillar-shaped silicon layer 104, the second pillar-shaped silicon layer 105, and the planar silicon layer 107. Here, the oxide film 109 is preferably deposited by normal-pressure CVD (chemical vapor-phase deposition). When a first oxide film 109 is deposited by normal-pressure CVD, a thick first oxide film 109 is deposited on the first pillar-shaped silicon layer 104, the second pillar-shaped silicon layer 105, and the planar silicon layer 107, and a thin first oxide film 109 is deposited on side walls of the first pillar-shaped silicon layer 104 and the second pillar-shaped silicon layer 105. According to the normal-pressure CVD, the thickness of the first oxide film 109 deposited on the first pillar-shaped silicon layer 104 and the second pillar-shaped silicon layer 105 is larger than the thickness of the first oxide film 109 deposited on the planar silicon layer 107.

Subsequently, as shown in FIGS. 10A to 10C, the oxide film 109 is removed by isotropic etching so as to form oxide film hard masks 111 and 112 on the first pillar-shaped silicon layer 104 and the second pillar-shaped silicon layer 105. A second oxide film 110 thicker than gate insulating films 113 and 114 (refer to FIGS. 11A to 11C) is formed on the planar silicon layer 107.

The description above has shown the first step of forming a planar silicon layer 107 (planar semiconductor layer) on a silicon substrate 101 (semiconductor substrate), forming a first pillar-shaped silicon layer 104 (first pillar-shaped semiconductor layer) and a second pillar-shaped silicon layer 105 (second pillar-shaped semiconductor layer) on the planar silicon layer 107.

Described in detail next is a second step that involves the following: Gate insulating films 113 and 114 (refer to FIGS. 11A to 11C) are formed around the first pillar-shaped silicon layer 104 (first pillar-shaped semiconductor layer) and the second pillar-shaped silicon layer 105 (second pillar-shaped semiconductor layer), and a metal film 115 and a thin polysilicon film 116 are formed around the gate insulating films 113 and 114. Here, the thickness of the polysilicon film 116 is adjusted to be smaller than a half of the distance between the first pillar-shaped silicon layer 104 (first pillar-shaped semiconductor layer) and the second pillar-shaped silicon layer 105 (second pillar-shaped semiconductor layer). Then a third resist 117 is deposited from above the polysilicon film 116, and the polysilicon film 116 on side walls of upper portions of the first pillar-shaped silicon layer 104 (first pillar-shaped semiconductor layer) and the second pillar-shaped silicon layer 105 (second pillar-shaped semiconductor layer) are exposed from the third resist 117. Then the polysilicon film 116 exposed from the third resist 117 is removed by etching, the third resist 117 is stripped, and the metal film 115 is removed by etching.

As shown in FIGS. 11A to 11C, first, gate insulating films 113 and 114 are formed around the first pillar-shaped silicon layer 104 and the second pillar-shaped silicon layer 105, and a metal film 115 and a thin polysilicon film 116 are formed around the gate insulating films 113 and 114. Since a thin polysilicon is used, occurrence of voids in the polysilicon film 116 is prevented. Here, titanium nitride is used as a material for the metal film 115 but any metal, such as titanium nitride, that is capable of setting a threshold voltage of a transistor and used in semiconductor production processes can be used as a material for the metal film 115. Those used in semiconductor processes, such as oxide films, oxynitride films, and high-k dielectric films, can be used as the gate insulating films 113 and 114.

Subsequently, as shown in FIGS. 12A to 12C, a third resist 117 is deposited, and the polysilicon film 116 on side walls of upper portions of the first pillar-shaped silicon layer 104 and the second pillar-shaped silicon layer 105 is exposed from the third resist 117. Preferably, resist etch back is employed to expose the polysilicon film 116 on the side walls of the upper portions. Alternatively, the polysilicon film 116 on the side walls of the upper portions may be exposed by using a coating film such as spin-on-glass.

Subsequently, as shown in FIGS. 13A to 13C, the polysilicon film 116 exposed from the third resist 117 is removed by etching. The polysilicon film 116 is preferably removed by isotropic dry etching.

Subsequently, as shown in FIGS. 14A to 14C, the third resist 117 is removed.

Subsequently, as shown in FIGS. 15A to 15C, the metal film 115 is removed by etching. In removing the metal film 115 on the upper portion of the first pillar-shaped silicon layer 104 and the second pillar-shaped silicon layer 105 by etching, the metal film 115 that lies between the polysilicon film 116 and the first pillar-shaped silicon layer 104 and between the polysilicon film 116 and the second pillar-shaped silicon layer 105 will be etched if wet etching is employed, and voids may occur between the polysilicon film 116 and the first pillar-shaped silicon layer 104 and between the polysilicon film 116 and the second pillar-shaped silicon layer 105.

The description above has shown the second step that involves the following: Gate insulating films 113 and 114 are formed around the first pillar-shaped silicon layer 104 (first pillar-shaped semiconductor layer) and the second pillar-shaped silicon layer 105 (second pillar-shaped semiconductor layer), and a metal film 115 and a thin polysilicon film 116 are formed around the gate insulating films 113 and 114. Here, the thickness of the polysilicon film 116 is controlled to be smaller than a half of the distance between the first pillar-shaped silicon layer 104 (first pillar-shaped semiconductor layer) and the second pillar-shaped silicon layer 105 (second pillar-shaped semiconductor layer). Then a third resist 117 is deposited from above the polysilicon film 116, and the polysilicon film 116 on side walls of upper portions of the first pillar-shaped silicon layer 104 (first pillar-shaped semiconductor layer) and the second pillar-shaped silicon layer 105 (second pillar-shaped semiconductor layer) are exposed from the third resist 117. Then the polysilicon film 116 exposed from the third resist 117 is removed by etching, the third resist 117 is stripped, and the metal film 115 is removed by etching.

Described in detail next is a third step of forming a fourth resist 118 for forming a gate line 119c and performing anisotropic etching so as to form a gate line 119c, a first gate electrode 119b, and a second gate electrode 119a.

Subsequently, as shown in FIGS. 16A to 16C, first, a fourth resist 118 for forming a gate line 119c (refer to FIGS. 17A to 17C) is formed. The height of the upper surface of the fourth resist 118 is preferably less than the height of the upper surface of the polysilicon film 116 that has undergone the second step. By employing anisotropic etching in forming the gate line 119c, the polysilicon film 116 above the first and second gate electrodes 119a and 119b (refer to FIGS. 17A to 17C) is removed and thus the height of the upper surface of the metal film 115 can be made more than the height of the upper surface of the polysilicon film 116.

Moreover, in the step shown in FIGS. 16A to 16C, the third resist 117 is preferably formed so that there is a particular offset (refer to FIGS. 17A to 17C) between the center line of the fourth resist 118 for forming a gate line 119c and the line connecting the center point of the first pillar-shaped silicon layer 104 and the center point of the second pillar-shaped silicon layer 105. When there is a particular offset as such, it becomes easier to form a silicide 135 (refer to FIGS. 28A to 28C) that connects a second n-type diffusion layer 122 to a second p-type diffusion layer 125.

Subsequently, as shown in FIGS. 17A to 17C, the polysilicon film 116 and the metal film 115 are etched to form first and second gate electrodes 119a and 119b, and a gate line 119c. As a result, a self-aligned process is realized. In this embodiment, it is sufficient to merely bring a fourth resist 118 for forming the gate line 119c into contact with the gate electrodes 119a and 119b formed around the silicon pillars. In this manner, the margin for alignment for the gate line 119c is increased and thus a self-aligned process is realized. During this process, upper portions of the first pillar-shaped silicon layer 104 and the second pillar-shaped silicon layer 105 are protected by the oxide film hard masks 111 and 112. Furthermore, since the polysilicon film 116 above the first gate electrode 119b and the second gate electrode 119a is removed by anisotropic etching, the height of the upper surface of the metal film 115 can be controlled to be more than the height of the upper surface of the polysilicon film 116.

Subsequently, as shown in FIGS. 18A to 18C, the second oxide film 110 is removed by etching.

Subsequently, as shown in FIGS. 19A to 19C, the fourth resist 118 is stripped and removed.

The description above has shown the third step of forming a fourth resist 118 for forming a gate line 119c and performing anisotropic etching so as to form a gate line 119c, a first gate electrode 119b, and a second gate electrode 119a.

Described in detail next is a fourth step that involves the following: A first n-type diffusion layer 121 is formed in an upper portion of the first pillar-shaped silicon layer 104 (first pillar-shaped semiconductor layer) and a second n-type diffusion layer 122 is formed in a lower portion of the first pillar-shaped silicon layer 104 and an upper portion of the planar silicon layer 107 (planar semiconductor layer). Then a first p-type diffusion layer 124 is formed in an upper portion of the second pillar-shaped silicon layer 105 (second pillar-shaped semiconductor layer) and a second p-type diffusion layer 125 is formed in a lower portion of the second pillar-shaped silicon layer 105 and an upper portion of the planar silicon layer 107.

As shown in FIGS. 20A to 20C, a fifth resist 120 for forming a first n-type diffusion layer 121 and a second n-type diffusion layer 122 is formed. Note that a thin oxide film may be deposited on an upper surface of the planar silicon layer 107 prior to forming the fifth resist 120.

Subsequently, as shown in FIGS. 21A to 21C, arsenic (As) is implanted into an upper portion and a lower portion of the first pillar-shaped silicon layer 104 so as to form a first n-type diffusion layer 121 and a second n-type diffusion layer 122.

Subsequently, as shown in FIGS. 22A to 22C, the fifth resist 120 is stripped and removed.

Subsequently, as shown in FIGS. 23A to 23C, a sixth resist 123 for forming a first p-type diffusion layer 124 and a second p-type diffusion layer 125 (refer to FIGS. 24A to 24C) is formed.

Subsequently, as shown in FIGS. 24A to 24C, boron or boron fluoride is implanted into an upper portion and a lower portion of the second pillar-shaped silicon layer 105 to form a first p-type diffusion layer 124 and a second p-type diffusion layer 125.

Subsequently, as shown in FIGS. 25A to 25C, the sixth resist 123 is stripped and removed.

Subsequently, as shown in FIGS. 26A to 26C, an oxide film 126 and a nitride film 127 are deposited to form uniform layers, and a heat treatment is conducted.

The description above has shown the fourth step that involves the following: A first n-type diffusion layer 121 is formed in an upper portion of the first pillar-shaped silicon layer 104 (first pillar-shaped semiconductor layer) and a second n-type diffusion layer 122 is formed in a lower portion of the first pillar-shaped silicon layer 104 and an upper portion of the planar silicon layer 107 (planar semiconductor layer). Then a first p-type diffusion layer 124 is formed in an upper portion of the second pillar-shaped silicon layer 105 (second pillar-shaped semiconductor layer) and a second p-type diffusion layer 125 is formed in a lower portion of the second pillar-shaped silicon layer 105 and an upper portion of the planar silicon layer 107.

Described in detail next is a fifth step of forming silicides 131, 135, 132, 134, 130, and 133 on the first n-type diffusion layer 121, the second n-type diffusion layer 122, the first p-type diffusion layer 124, the second p-type diffusion layer 125, and the gate line 119c.

As shown in FIGS. 27A to 27C, first, the oxide film 126 and the nitride film 127 are partly removed by etching so as to form insulating film side walls 128a, 128b, 129a, 129b, and 129c.

Subsequently, as shown in FIGS. 28A to 28C, a metal material is deposited and a heat treatment is performed to remove unreacted metal materials so as to form silicides 131, 135, 132, 134, 130, and 133 on the first n-type diffusion layer 121, the second n-type diffusion layer 122, the first p-type diffusion layer 124, the second p-type diffusion layer 125, and the gate line 119c. Here, the insulating film side walls may be nitride film side walls.

As a result, the second n-type diffusion layer 122 connects to the second p-type diffusion layer 125 via the silicide 135. As shown in FIGS. 17A to 17C, since there is a particular offset between the center line of the gate line 119c and the line connecting the center point of the first pillar-shaped silicon layer 104 and the center point of the second pillar-shaped silicon layer 105, formation of the silicide 135 is easy. Consequently, high integration of semiconductor devices is achieved.

According to this structure, since the polysilicon film 116 is thin, the gate line 119c can be easily formed to have a laminated structure constituted by the metal film 115 and the silicide 130. Since the silicide 130 and the metal film 115 come in direct contact with each other in the gate line 119c, the resistance of the gate line 119c is decreased.

The description above has shown the fifth step of forming silicides 131, 135, 132, 134, 130, and 133 on the first n-type diffusion layer 121, the second n-type diffusion layer 122, the first p-type diffusion layer 124, the second p-type diffusion layer 125, and the gate line 119c.

Subsequent to the fifth step, as shown in FIGS. 29A to 29C, a contact stopper 136 such as a nitride film is deposited to form a layer that covers the entire structure so as to form an interlayer insulating film 137.

Subsequently, as shown in FIGS. 30A to 30C, a seventh resist 138 for forming contact holes 139 and 140 (refer to FIGS. 31A to 31C) is formed.

Subsequently, as shown in FIGS. 31A to 31C, the interlayer insulating film 137 is etched to form contact holes 139 and 140 in openings of the seventh resist 138.

Subsequently, as shown in FIGS. 32A to 32C, the seventh resist 138 is stripped and removed.

Subsequently, as shown in FIGS. 33A to 33C, an eighth resist 141 for forming contact holes 142 and 143 (refer to FIGS. 34A to 34C) is formed.

Subsequently, as shown in FIGS. 34A to 34C, the interlayer insulating film 137 is etched to form contact holes 142 and 143 in openings of the eighth resist 141.

Subsequently, as shown in FIGS. 35A to 35C, the eighth resist 141 is stripped and removed.

Subsequently, as shown in FIGS. 36A to 36C, the contact stopper 136 is etched to remove the contact stopper 136 under the contact holes 139 and 140 and the contact holes 142 and 143.

Subsequently, as shown in FIGS. 37A to 37C, a metal material is deposited to form a metal layer 148 so as to form contacts 144, 145, 146, and 147 that form connections with conductor layers at lower levels.

Subsequently, as shown in FIGS. 38A to 38C, ninth resists 149, 150, 151, and 152 for forming metal lines 153, 154, 155, and 156 (refer to FIGS. 39A to 39C) are formed.

Subsequently, as shown in FIGS. 39A to 39C, the metal layer 148 is etched to form metal lines 153, 154, 155, and 156.

Subsequently, as shown in FIGS. 40A to 40C, the ninth resists 149, 150, 151, and 152 are stripped and removed.

The description above has shown the method for producing a semiconductor device having an SGT structure in which a gate electrode composed of a metal material is formed by using a thin gate material (polysilicon) by a self-aligned process.

Since the height of the upper surface of the metal film 115 is more than the height of the upper surface of the polysilicon film 116, voids do not occur between the polysilicon film 116 and the first pillar-shaped silicon layer 104 and between the polysilicon film 116 and the second pillar-shaped silicon layer 105, and the decrease in the capacity between the gate electrodes 119a and 119b and the first pillar-shaped silicon layer 104 and second pillar-shaped silicon layer 105 can be prevented.

A semiconductor device having an SGT produced by this embodiment includes a second oxide film 110 thicker than the gate insulating films 113 and 114 formed between the gate line 119c and the planar silicon layer 107. Thus, the capacity between the gate line 119c and the silicon substrate 101 can be decreased and insulation between the gate line 119c and the silicon substrate 101 is ensured.

According to this embodiment, the gate line 119c is formed of a laminated structure constituted by a metal film 115 and a silicide 130. As such, since the silicide 130 and the metal film 115 in the gate line 119c make direct contact to each other, the resistance of the gate line 119c is decreased.

According to this embodiment, there is a particular offset (refer to FIGS. 17A to 17C) between the center line of the gate line 119c and the line connecting the center point of the first pillar-shaped silicon layer 104 and the center point of the second pillar-shaped silicon layer 105. Accordingly, a silicide 135 that connects the second n-type diffusion layer 122 to the second p-type diffusion layer 125 can be easily formed. As a result, high-integration of semiconductor devices is achieved on a mass production basis.

According to the embodiment described above, the first step is followed by a second step that involves the following: Gate insulating films 113 and 114 are formed around the first pillar-shaped silicon layer 104 (first pillar-shaped semiconductor layer) and the second pillar-shaped silicon layer 105 (second pillar-shaped semiconductor layer) after the first step. Subsequently, a metal film 115 and a thin polysilicon film 116 are formed around the gate insulating films 113 and 114. The thickness of the polysilicon film 116 is to be smaller than a half of the distance between the first pillar-shaped silicon layer 104 and the second pillar-shaped silicon layer 105. Then a third resist 117 is deposited and the polysilicon film 116 on side walls of upper portions of the first pillar-shaped silicon layer 104 and the second pillar-shaped silicon layer 105 is exposed. Then the exposed polysilicon film 116 is removed by etching, the third resist 117 is stripped, and the metal film 115 is removed by etching. This second step is followed by a third step of forming a fourth resist 118 for forming a gate line 119c and performing anisotropic etching so as to form a gate line 119c, a first gate electrode 119b, and a second gate electrode 119a. As a result, a self-aligned process is realized. According to this embodiment, since a semiconductor device is produced by a self-aligned process, there is no need to use a mask formed of a different member and thus high integration of semiconductor devices is achieved.

In removing the metal film 115 on the upper portion of the first pillar-shaped silicon layer 104 and the second pillar-shaped silicon layer 105 by etching, the metal film 115 that lies between the polysilicon film 116 and the first pillar-shaped silicon layer 104 and between the polysilicon film 116 and the second pillar-shaped silicon layer 105 will be etched if wet etching is employed. As a result, voids may occur between the polysilicon film 116 and the first pillar-shaped silicon layer 104 and between the polysilicon film 116 and the second pillar-shaped silicon layer 105. If voids occur as such, the specific dielectric constant (ratio of the dielectric constant of a medium to the dielectric constant of vacuum, $\epsilon/\epsilon 0 = \epsilon r$) of the part where voids occurred turns out to be approximately 1 (1.00059) which is about the same as that of air and thus the capacity between the gate electrodes 119a and 119b and the first pillar-shaped silicon layer 104 and second pillar-shaped silicon layer 105 is decreased. However, in this embodiment, the gate line 119c is formed by anisotropic etching after the metal film 115 on the upper portions of the first pillar-shaped silicon layer 104 and the second pillar-shaped silicon layer 105 is removed by etching. During this process, since the polysilicon film 116 that lies above the first and second gate electrodes 119b and 119a is removed by anisotropic etching, the height of the upper surface of the metal film 115 can be controlled to be more than the height of the upper surface of the polysilicon film 116. Accordingly, occurrence of voids between the polysilicon film 116 and the first pillar-shaped silicon layer 104 and between the polysilicon film 116 and the second pillar-shaped silicon layer 105 can be prevented.

Note that various embodiments and modifications of the present invention are possible without departing from the broad spirit and scope of the present invention. The embodiment described above is merely illustrative and does not limit the scope of the present invention. The embodiments and modifications can be freely combined. Omitting some of the features of the embodiment as needed is also within the technical idea of the present invention.

For example, in the embodiment described above, a method for producing a semiconductor device in which p-type (including p$^+$-type) and n-type (including n$^+$-type) are revered, and a semiconductor device obtained by such a method naturally fall within the technical scope of the present invention.

According to a semiconductor device production method of the present invention, a semiconductor device that is highly integrated and has SGTs can be produced.

What is claimed is:

1. A semiconductor device comprising:
    a planar semiconductor layer formed on a semiconductor substrate;
    first and second pillar-shaped semiconductor layers formed on the planar semiconductor layer;
    a first gate insulating film formed around the first pillar-shaped semiconductor layer;
    a first gate electrode having a laminated structure constituted by a metal film and a polysilicon film formed around the first gate insulating film;
    a second gate insulating film formed around the second pillar-shaped semiconductor layer;
    a second gate electrode having a laminated structure constituted by a metal film and a polysilicon film formed around the second gate insulating film;
    a gate line connected to the first and second gate electrodes;
    an oxide film formed between the gate line and the planar semiconductor layer and having a thickness larger than that of the gate insulating film;
    a first n-type diffusion layer formed in an upper portion of the first pillar-shaped semiconductor layer;
    a second n-type diffusion layer formed in a lower portion of the first pillar-shaped semiconductor layer and an upper portion of the planar semiconductor layer;
    a first p-type diffusion layer formed in an upper portion of the second pillar-shaped semiconductor layer; and
    a second p-type diffusion layer formed in a lower portion of the second pillar-shaped semiconductor layer and an upper portion of the planar semiconductor layer,
    wherein a thickness of the polysilicon film is smaller than a half of a distance between the first pillar-shaped semiconductor layer and the second pillar-shaped semiconductor layer,
    a height of an upper surface of the metal film is more than a height of an upper surface of the polysilicon film, and
    a height of an upper surface of the gate line is less than a height of upper surfaces of the first and second gate electrodes.

2. The semiconductor device according to claim 1, wherein the gate line has a laminated structure constituted by the metal film and a silicide.

3. The semiconductor device according to claim 2, wherein there is a particular offset between a center line of the gate line and a line that connects a center point of the first pillar-shaped semiconductor layer and a center point of the second pillar-shaped semiconductor layer.

4. The semiconductor device according to claim 3, further comprising silicides formed on the first and second n-type diffusion layers and the first and second p-type diffusion layers.

* * * * *